US012787361B2

(12) United States Patent
Bao

(10) Patent No.: US 12,787,361 B2
(45) Date of Patent: Nov. 3, 2026

(54) INTEGRATION OF DIFFERENT GATE DIELECTRICS NANOSHEET DEVICES

(71) Applicant: International Business Machines Corporation, Armonk, NY (US)

(72) Inventor: Ruqiang Bao, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 383 days.

(21) Appl. No.: 18/541,181

(22) Filed: Dec. 15, 2023

(65) Prior Publication Data

US 2025/0203934 A1 Jun. 19, 2025

(51) Int. Cl.

| | |
|---|---|
| ***H10D 30/67*** | (2025.01) |
| ***H10D 30/01*** | (2025.01) |
| ***H10D 30/43*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |
| ***H10D 84/83*** | (2025.01) |

(52) U.S. Cl.

CPC ....... *H10D 30/6735* (2025.01); *H10D 30/014* (2025.01); *H10D 30/43* (2025.01); *H10D 30/6729* (2025.01); *H10D 30/6739* (2025.01); *H10D 62/121* (2025.01); *H10D 64/017* (2025.01); *H10D 84/0135* (2025.01); *H10D 84/0144* (2025.01); *H10D 84/0149* (2025.01); *H10D 84/038* (2025.01); *H10D 84/83* (2025.01); *H10D 30/6736* (2025.01)

(58) Field of Classification Search

CPC ........... H10D 30/6735; H10D 84/8314; H10D 30/6736

See application file for complete search history.

(56) References Cited

U.S. PATENT DOCUMENTS

| | | | |
|---|---|---|---|
| 7,402,480 | B2 | 7/2008 | Hébert |
| 7,790,544 | B2 | 9/2010 | Zhou |
| 9,224,826 | B2 | 12/2015 | Kwon |

(Continued)

FOREIGN PATENT DOCUMENTS

| | | |
|---|---|---|
| WO | 2021007002 W | 1/2021 |

OTHER PUBLICATIONS

Lin et al. T "Comprehensive Study of Stacked Nanosheet-Type Channel Based on Junctionless Gate-All-Around Thin-Film Transistors", this article has been accepted for publication in a future issue of this journal, but has not been fully edited. Content may change prior to final publication. Citation information: DOI 10.1109/JEDS.2019.2937142, IEEE Journal of the Electron Devices Society. pp. 4.

(Continued)

*Primary Examiner* — Nduka E Ojeh

(74) *Attorney, Agent, or Firm* — Seed Intellectual Property Law Group LLP

(57) ABSTRACT

A semiconductor structure includes a first gate-all-around field effect transistor, which in turn includes an upper nanosheet and a first gate structure. The first gate structure is laterally confined by first gate spacers and surrounds the upper nanosheet. The first gate structure includes a first gate dielectric on the upper nanosheet and a u-shaped first high-k material on a lower portion of the first gate spacers and on the first gate dielectric.

15 Claims, 30 Drawing Sheets

(56) References Cited

U.S. PATENT DOCUMENTS

| | | | | | |
|---|---|---|---|---|---|
| 9,935,014 | B1 | | 4/2018 | Cheng | |
| 10,141,403 | B1 | | 11/2018 | Cheng | |
| 10,229,971 | B1 | | 3/2019 | Cheng | |
| 10,700,064 | B1 | * | 6/2020 | Zhang | B82Y 10/00 |
| 2016/0027893 | A1 | | 1/2016 | Kwon | |
| 2019/0198629 | A1 | | 6/2019 | Yeung | |
| 2021/0358924 | A1 | * | 11/2021 | Song | H10D 84/038 |
| 2022/0044937 | A1 | * | 2/2022 | Lee | H10D 30/014 |
| 2022/0052186 | A1 | | 2/2022 | Gardner | |
| 2022/0059678 | A1 | * | 2/2022 | Jhan | H10D 30/024 |
| 2022/0310456 | A1 | | 9/2022 | Hall | |
| 2022/0328319 | A1 | * | 10/2022 | Lee | H10D 30/014 |
| 2022/0367688 | A1 | * | 11/2022 | Hsiao | H10D 30/024 |
| 2022/0375936 | A1 | * | 11/2022 | Chu | H10D 30/6735 |
| 2023/0061018 | A1 | | 3/2023 | Lee | |
| 2025/0040200 | A1 | * | 1/2025 | Chen | H10D 30/6757 |

OTHER PUBLICATIONS

James D. Plummer et al., Silicon VLSI Technology: Fundamentals, Practice, and Modeling 1st Edition, Prentice Hall, 2001. pp. 817.

P.H. Holloway et al., Handbook of Compound Semiconductors: Growth, Processing, Characterization, and Devices, Cambridge University Press, 2008. pp. 926.

Peter Mell and Timothy Grance, The NIST Definition of Cloud Computing, NIST Special Publication 800-145, Sep. 2011, cover, pp. i-iii and 1-3.

* cited by examiner

INTEGRATION OF DIFFERENT GATE DIELECTRICS NANOSHEET DEVICES

BACKGROUND

The present invention relates generally to semiconductor devices, and more specifically, to nanosheet transistors.

Higher voltage devices for input and/or output circuits need thicker gate dielectrics as compared to standard gate devices, which have a lower voltage and can be employed, e.g., in logic devices. Replacement gate field effect transistors are compatible with both thin and thick gate dielectric transistors. However, integration schemes that employ replacement gate field effect transistors, tend to physically expose silicon-oxide-based dielectric material portions to damaging etch processes prior to deposition of a high-k gate dielectric material thereupon. Furthermore, in nanosheet transistors, thick gate oxide integration schemes may remove a nanosheet to accommodate thicker oxides, but at the expense of less current and challenging process control.

BRIEF SUMMARY

Principles of the invention provide techniques for integration of different gate dielectrics nanosheet devices. In one aspect, an exemplary semiconductor structure includes a first gate-all-around field effect transistor, the first gate-all-around field effect transistor including an upper nanosheet and a first gate structure surrounding the upper nanosheet and laterally confined by first gate spacers. The first gate structure includes a first gate dielectric on the upper nanosheet and a u-shaped first high-k material on a lower portion of the first gate spacers and on the first gate dielectric.

In another aspect, another exemplary semiconductor chip includes a first transistor and a second transistor. The first transistor including a first gate trench having a bottom and sidewalls, a first upper nanosheet defining the bottom of the first gate trench, a first pair of gate spacers (having a lower portion and an upper portion) above the first upper nanosheet defining a portion of the sidewalls of the first gate trench, a first gate dielectric on the first upper nanosheet, and a u-shaped first high-k dielectric 410 on the first gate dielectric and on the lower portion of the first pair of gate spacers. The second transistor including a second gate trench having a bottom and sidewalls, a second upper nanosheet defining the bottom of the gate trench, a second pair of gate spacers above the second upper nanosheet defining a portion of the sidewalls of the second gate trench, a second gate dielectric on the second upper nanosheet, and a u-shaped second high-k material on the second gate dielectric and on the sidewalls of the second pair of gate spacers.

In still a further aspect, an exemplary method of forming a semiconductor structure includes providing a substrate having a first patterned stack and a second patterned stack wherein each stack comprises alternating layers of a nanosheet and a sacrificial material wherein each stack has an upper nanosheet, a source and a drain on either side of each of the first and second patterned stacks, a dummy gate over each patterned stack wherein each dummy gate is flanked by a pair of gate spacers; removing dummy gates and the sacrificial material from the first patterned stack to expose the nanosheets and to a first gate trench; forming a thick gate dielectric and a first high-k dielectric in the first gate trench; recessing the first high-k dielectric in the first gate trench in the first patterned stack to expose an upper sidewall of the pair of gate spacer; forming a mask over the first gate trench; removing the dummy gate and the sacrificial material from the second patterned stack to form a second gate trench; forming a thin gate dielectric and a second high-k dielectric in the second gate trench of the second patterned stack; removing the mask from the first gate trench; forming a work function material in each of the first and second gate trenches; forming metal gate fill in the first gate trench of the first patterned stack; forming contacts to the source and drain on each side of first and second patterned stacks; forming a first gate contact to the work function material and the metal gate fill of the first gate trench of the first patterned stack; and forming a second gate contact to the work function material of the second gate trench of the second patterned stack.

As used herein, "facilitating" an action includes performing the action, making the action easier, helping to carry the action out, or causing the action to be performed. Thus, by way of example and not limitation, instructions executing on a processor might facilitate an action carried out by semiconductor fabrication equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects, as will be discussed further below. Features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1A:
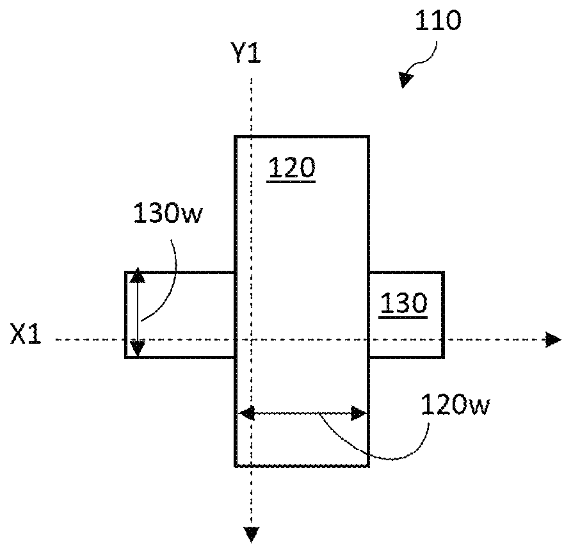
FIGS. 1A and 1B are top-down views of semiconductor structures in accordance with an aspect of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Given the discussion herein (reference characters refer to the drawings discussed below), in aspects of the invention a semiconductor chip includes two transistors built on a common substrate. The first transistor includes a first gate trench having a bottom and sidewalls, a first upper nanosheet 230 defining the bottom of the first gate trench, a first pair of gate spacers 280 above the first upper nanosheet 230 defining a portion of the sidewalls of the first gate trench, wherein the first pair of gate spacers has a lower portion and an upper portion, a first gate dielectric 400 on the first upper nanosheet 230, and a u-shaped first high-k dielectric 410 on the first gate dielectric 400 and on the lower portion of the first pair of gate spacers 280 (See FIG. 10A). The second transistor 140 includes a second gate trench having a bottom and sidewalls, a second upper nanosheet 230 defining the bottom of the gate trench, a second pair of gate spacers 280 above the second upper nanosheet defining a portion of the sidewalls of the second gate trench, a second gate dielectric 800 on the second upper nanosheet 230, and a u-shaped second high-k dielectric 810 on the second gate dielectric 800 and on the sidewalls of the second pair of gate spacers 280 (See FIG. 10C). The technical benefits include a single substrate that can accommodate both logic nanosheet transistors and input/output ("IO") nanosheet transistors, and a reduced gate resistance of the first transistor.

The thickness of the first gate dielectric 400 is greater (e.g. one to three times greater) than the thickness of the second gate dielectric 800. The first and second gate dielectrics can include one or more of silicon nitride and a silicon oxide. The technical benefits include a single substrate that can accommodate both logic nanosheet transistors and input/output ("IO") nanosheet transistors, and the use of manufacturable materials.

The first and second high-k materials are the same materials with the same thicknesses. The technical benefits are fewer process steps.

Figure 10A:
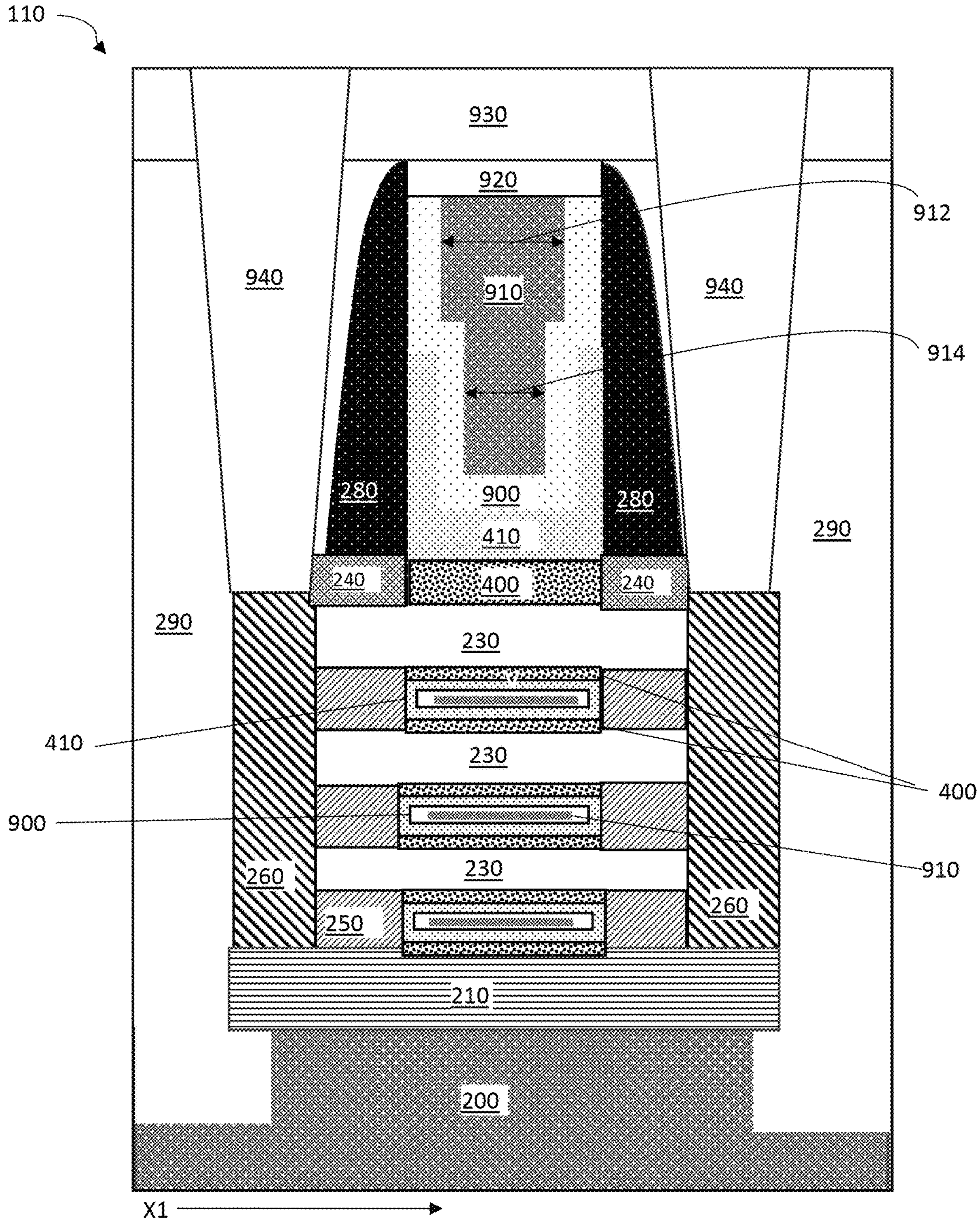
FIGS. 10A-10D are cross-sectional views of the structures of FIGS. 9A-9D, forming contacts to the source drain and gates, in accordance with an aspect of the invention.
Figure 10B:
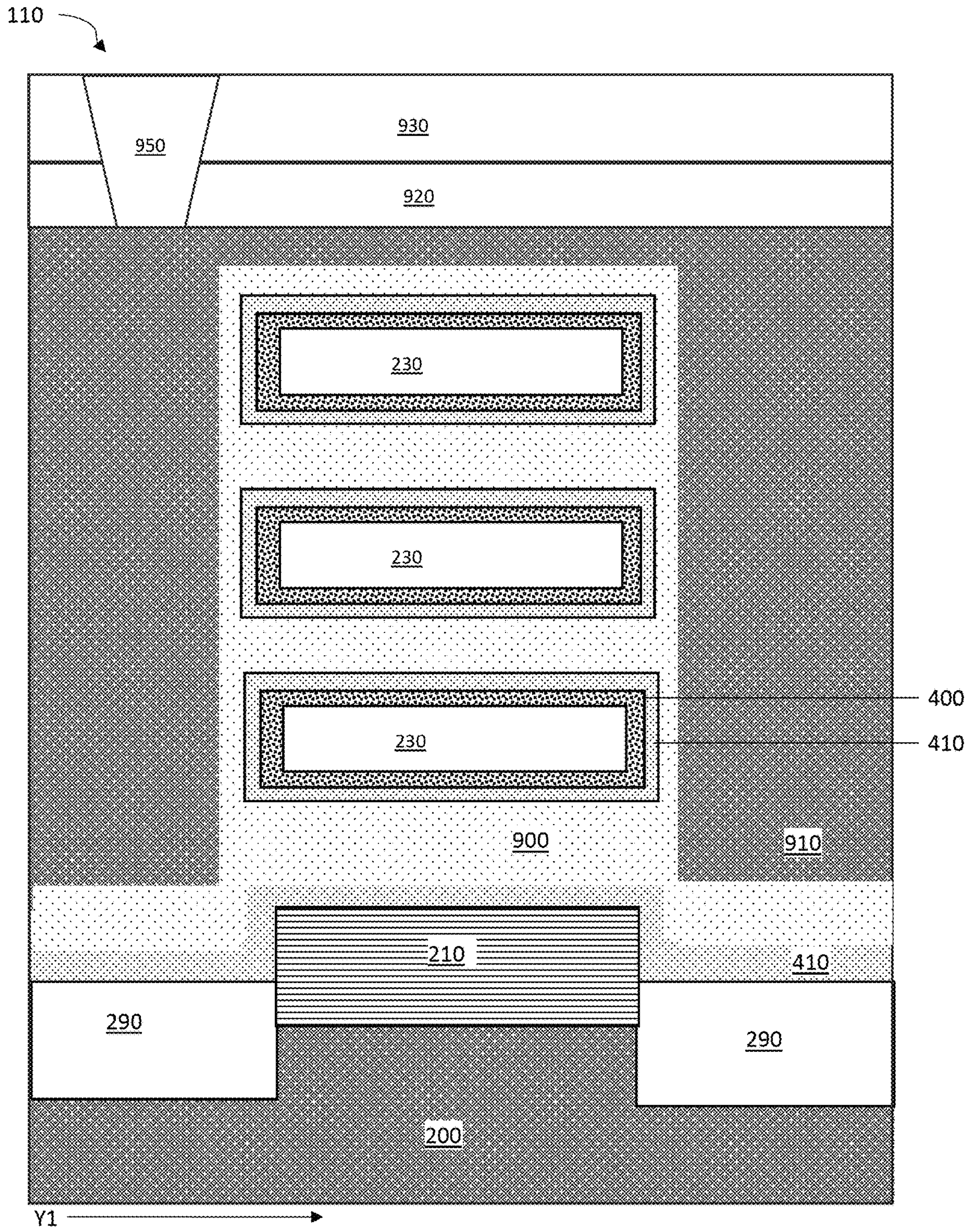
Figure 10C:
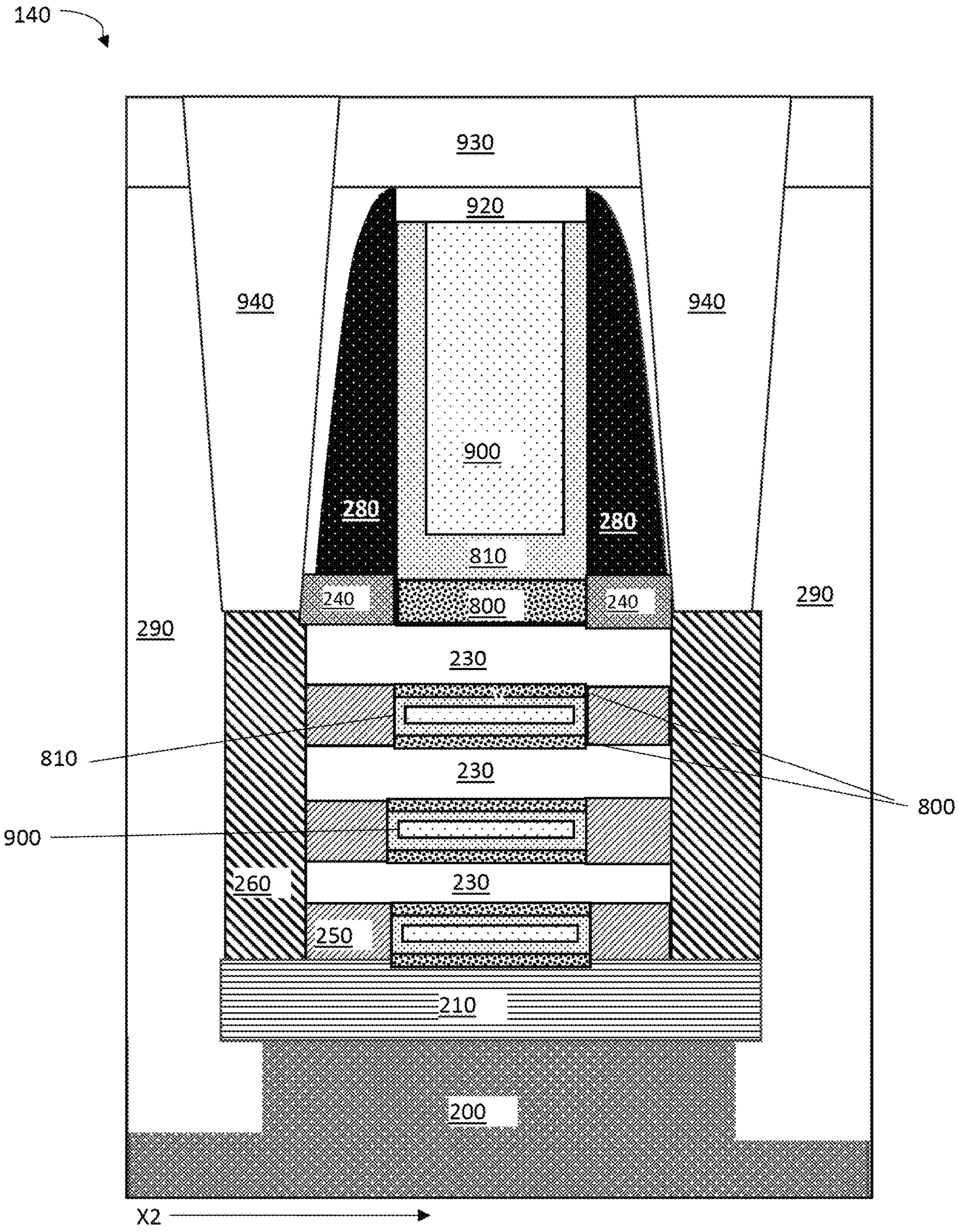
Figure 10D:
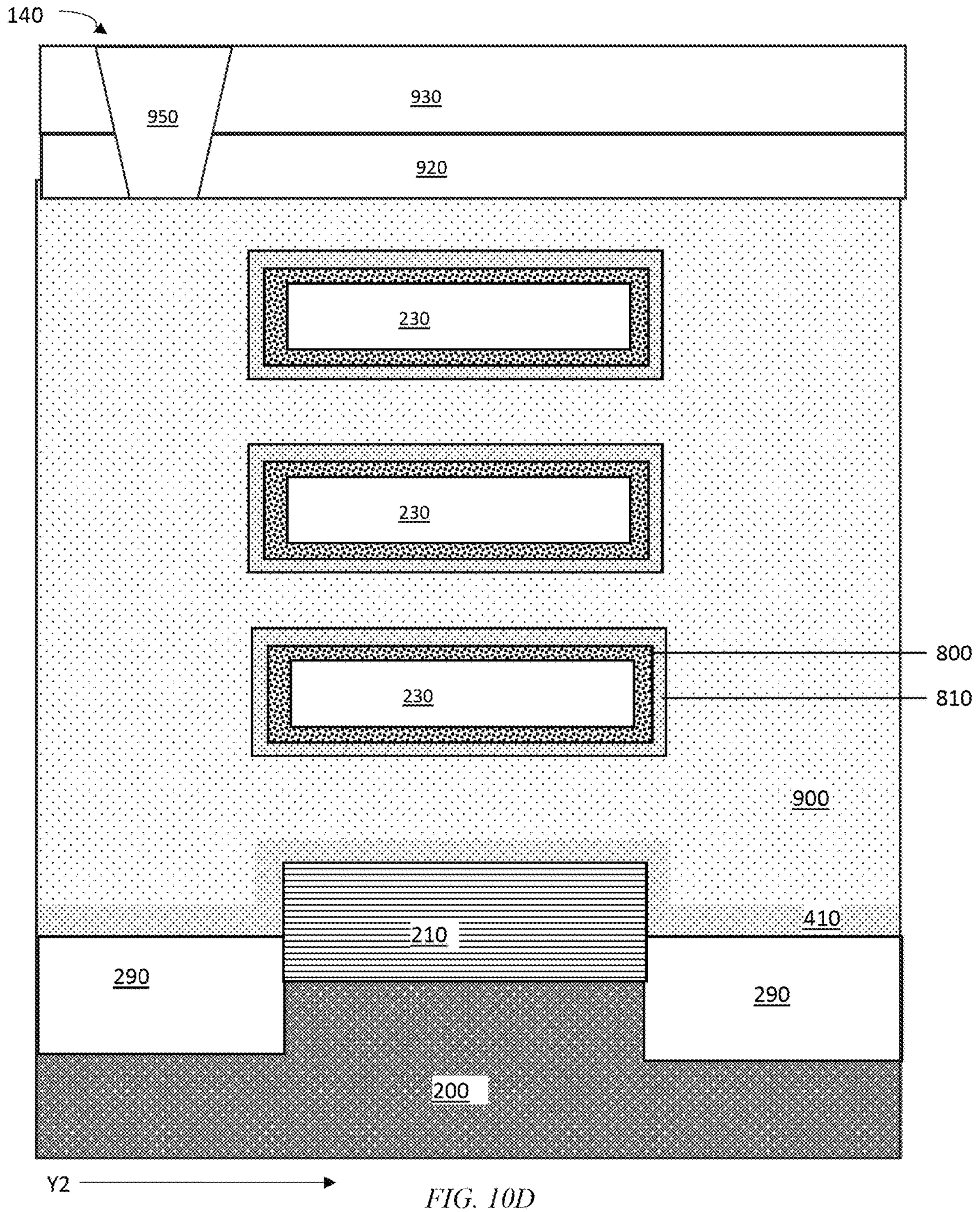

A top dielectric 240 can be in contact with the upper nanosheet 230 and below the first pair of gate spacers 280 wherein the top dielectric further defines the sidewall of the gate trench and the first gate dielectric 400 can be laterally confined by a top dielectric 240 and vertically confined by the upper nanosheet 230 and the first high-k dielectric 410 (See FIG. 10A). The top dielectric 240 can further define the sidewall of the gate trench. The first gate dielectric 400 can be u-shaped and in contact with the upper nanosheet 230, the top dielectric 240 and the first pair of gate spacers 280 (See FIG. 12A). The technical benefit is the enablement of manufacturing a nanosheet transistors.

Figure 12A:
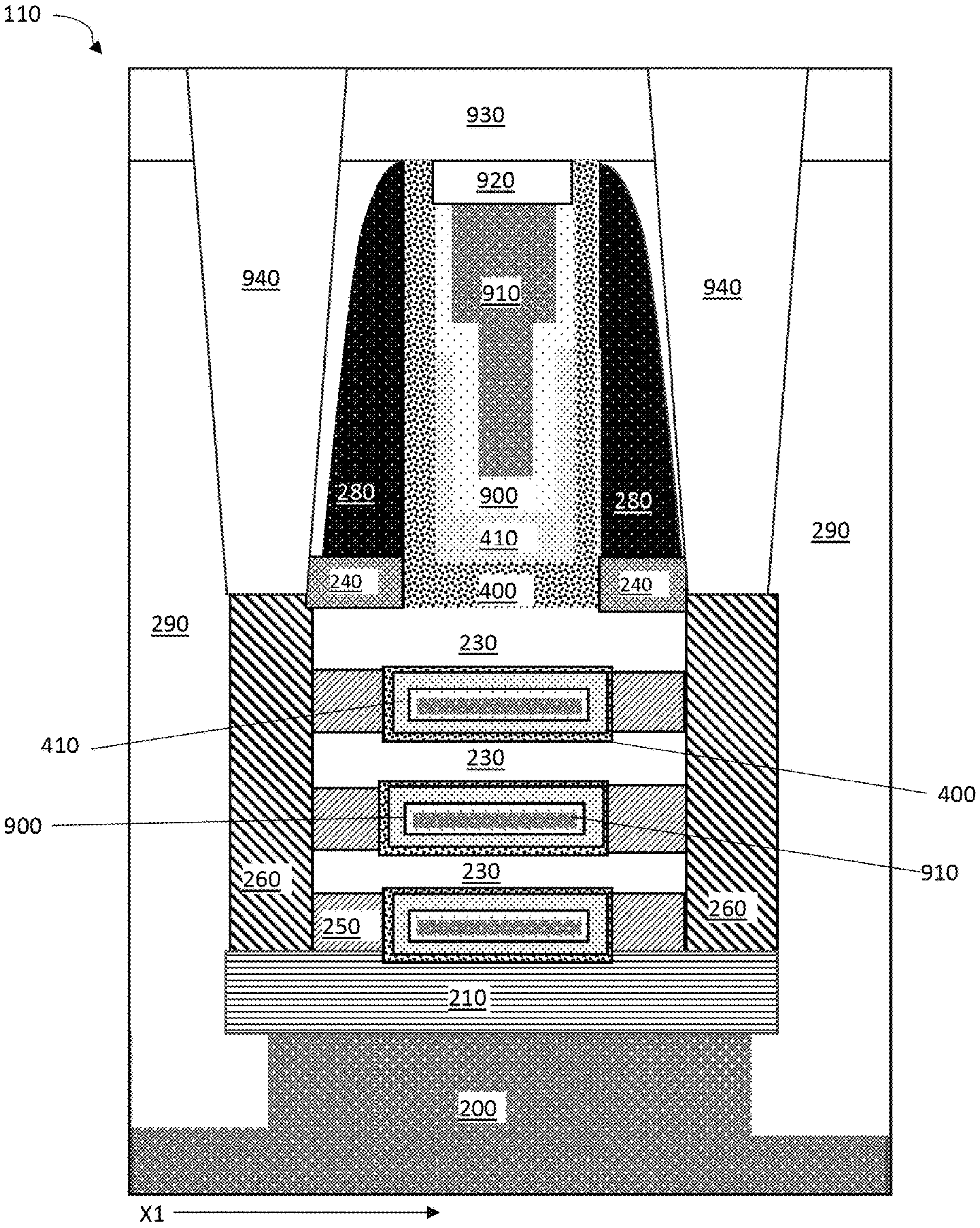
FIGS. 12A-12B are cross-sectional views of the structures of FIGS. 11A-11B, after further processing and forming source, drain and gate contacts in each transistor, in accordance with an aspect of the invention.

Still referring to FIG. 12A, each of the first gate dielectric 400 and the first high-k dielectric 410 have an uppermost portion wherein the uppermost portion of the first gate dielectric 400 is higher than the upper most portion of the high-k dielectric 410. The technical benefit is reduced gate resistance.

Referring to the first gate trench, it can be lined with a work function material and be filled by a metal fill 910 filling while an insulating metal gate cap 920 is located above and in contact with the metal fill 910 and work function material 900. The gate cap 920 can be coplanar with the first gate dielectric 400. The technical benefit is the enablement of manufacturing the gates of the nanosheet transistors.

Figure 12B:
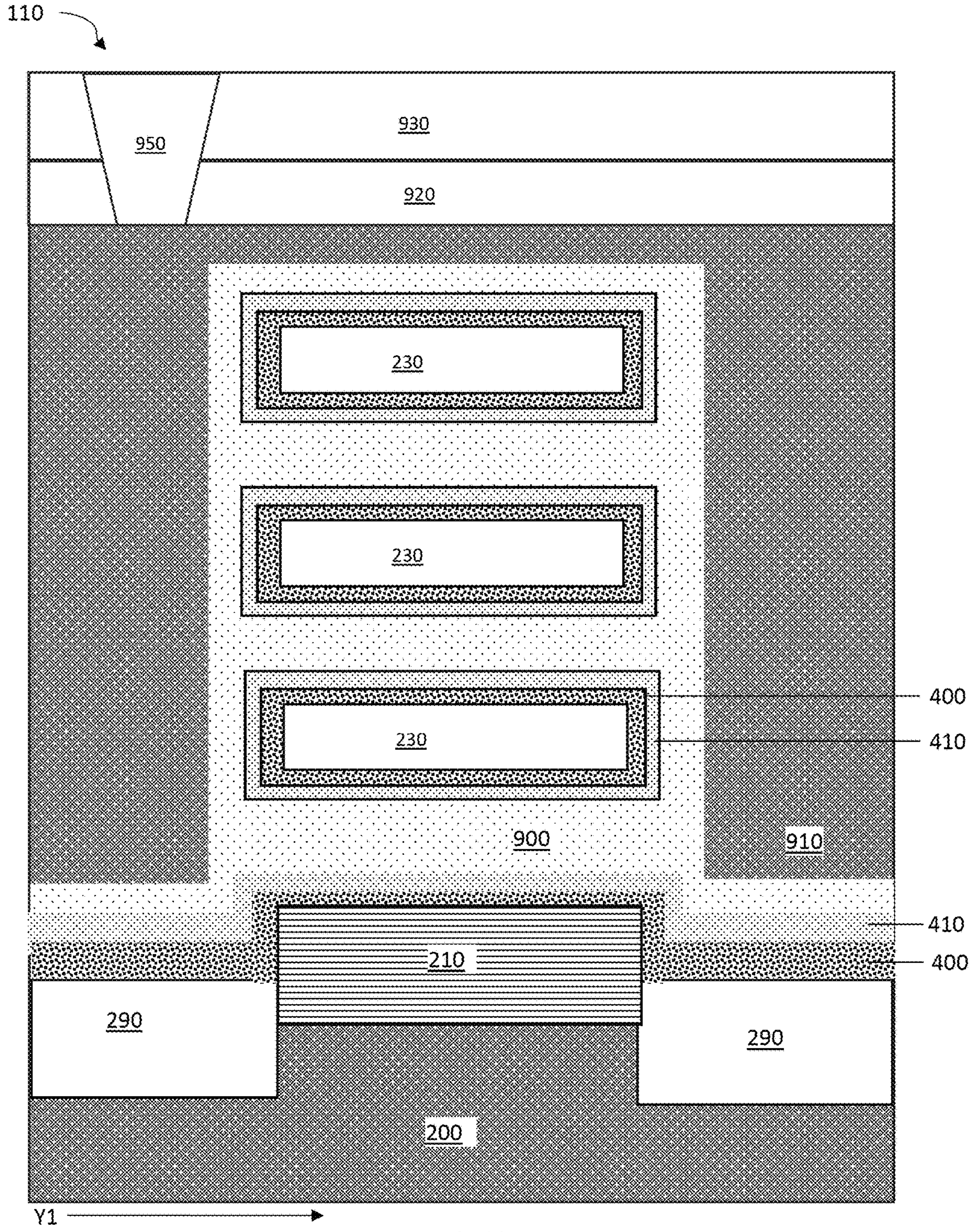

In another aspect, one or more embodiments of the invention provide for a semiconductor structure including a first gate-all-around field effect transistor 110, the first gate-all-around field effect transistor ("GAA FET") including an upper nanosheet 230 and a first gate structure wherein the first gate structure is laterally confined by first gate spacers 280 and surrounds the upper nanosheet 230. The first gate structure also includes a first gate dielectric 400 on the upper nanosheet and a u-shaped first high-k dielectric 410 on a lower portion of the first gate spacers 280 and on the first gate dielectric 400, a u-shaped first work function material 900 in contact with an upper portion of the first gate spacers 280 and in contact with the first high-k dielectric 410, and a first metal gate fill 910 in contact with the first work function material 900. The first metal gate fill 910 has a top dimension 912 greater than a bottom dimension 914. The first gate dielectric 400 is in contact with the entire height of the gate spacer 280 and is sandwiched by the gate spacer 280 and first high-k dielectric 410 on the lower portion of the first gate spacers 280 (See FIG. 12A). Also referring to FIG. 12A, an insulating metal gate cap 920 can be located above the metal fill 910 and work function material 900, which is coplanar with the first gate dielectric 400. Referring to FIG. 12B, the first gate dielectric 400 is in contact with all surfaces of the upper nanosheet. Still referring to FIG. 12B, an adjacent nanosheet 230 below the upper nanosheet 230 is separated by a vertical distance, wherein the first dielectric 400 is 20 to 80% of the vertical distance. The technical benefits include a single substrate that can accommodate both logic nanosheet transistors and input/output ("IO") nanosheet transistors, and a reduced gate resistance of the first transistor.

In an aspect of forming a semiconductor structure a substrate is provided having a first patterned stack and a second patterned stack wherein each stack comprises alternating layers of a nanosheet 230 and a sacrificial material 220 wherein each stack has an upper nanosheet, a source and a drain 260 on either side of each of the first and second patterned stacks, a dummy gate 270 over each patterned stack wherein each dummy gate 270 is flanked by a pair of gate spacers 280 (See FIGS. 2A-2D). Next dummy gates 270 and sacrificial material 220 are removed from the first patterned stack to expose the nanosheets 230 and to a first gate trench (See FIG. 3A). A thick gate dielectric 400 and a first high-k dielectric 410 is formed in the first gate trench (See FIG. 4A). Note that forming the thick gate dielectric 400 can include forming the thick gate dielectric on sidewalls of the pair of gate spacers 280 of the first patterned stack (See FIG. 12A). The first high-k dielectric in the first gate trench in the first patterned stack is recessed to expose an upper sidewall of the pair of gate spacer 280 and a mask 600 is formed over the first gate trench (See FIG. 6A). Next the dummy gate 270 and the sacrificial material 220 are removed from the second patterned stack to form a second gate trench (See FIG. 7C). A thin gate dielectric 800 and a second high-k dielectric 810 is formed in the second gate trench of the second patterned stack (See FIG. 8C). The mask 600 is removed from the first gate trench. A work function material 900 is formed in each of the first and second gate trenches (See FIGS. 9A and 9C). A metal fill 910 is in the first gate trench of the first patterned stack and contact 940/950 are formed to the source and drain on each side of first and second patterned stacks and to the work function material 900 and the metal gate fill of the first gate trench of the first patterned stack. A second gate contact 950 is made to the work function material 900 of the second gate trench of the second patterned stack. Further method steps may include forming a reliability titanium nitride (reliability TiN 500) and a polysilicon fill 510 over the thick gate dielectric 400 and a first high-k dielectric 410 in the gate trench of the first patterned stack (See FIG. 5A) and recessing the reliability the titanium nitride 500, the polysilicon fill 510 in the first patterned stack 110 to expose upper sidewalls of the gate spacer 280 (See FIG. 6A). A second reliability TiN 510 and a second polysilicon fill 500 material may be formed in the second gate trench of the second patterned stack (See FIG. 8C). The second reliability TiN 510, the second polysilicon fill 500 material of the second patterned stack and the mask 600 of the first patterned stack can be planarized to the gate spacers 280 (See FIGS. 8A and 8C) and the structure annealed. The first and second reliability TiN, first and second polysilicon fill materials can be removed to expose first high-k dielectric 410 and an upper portion of the sidewall of the gate spacer 280 in the first gate trench of the first patterned stack and to expose the second high-k dielectric 810 material second gate trench of the second patterned stack. The technical benefit is providing a manufacturable way to integrate on a single substrate both logic nanosheet transistors and input/output ("I/O") nanosheet transistors, and a reduced gate resistance of a transistor.

Techniques as disclosed herein can provide substantial beneficial technical effects. Some embodiments may not have these potential advantages and these potential advantages are not necessarily required of all embodiments. By way of example only and without limitation, one or more embodiments may provide one or more of allowing further scaling, enhanced yield, improved performance (e.g. lower gate resistance of a transistor), and/or enhanced reliability for GAA semiconductor structures using logic and I/O transistors on the same chip.

One or more embodiments integrate thin and thick gate dielectric nanosheet transistors on the same chip. Indeed, in order to provide reliable semiconductor devices of various types, an integration scheme is provided that advantageously allows use of replacement gate structures with multiple types of gate dielectrics without damaging portions of the transistor(s). Methods of making thick dielectric and thin gate dielectric transistors on the same chip, and the resulting structures, will be described with the aid of the following text and figures. Note that figures are not necessarily drawn to scale.

Figure 1B:
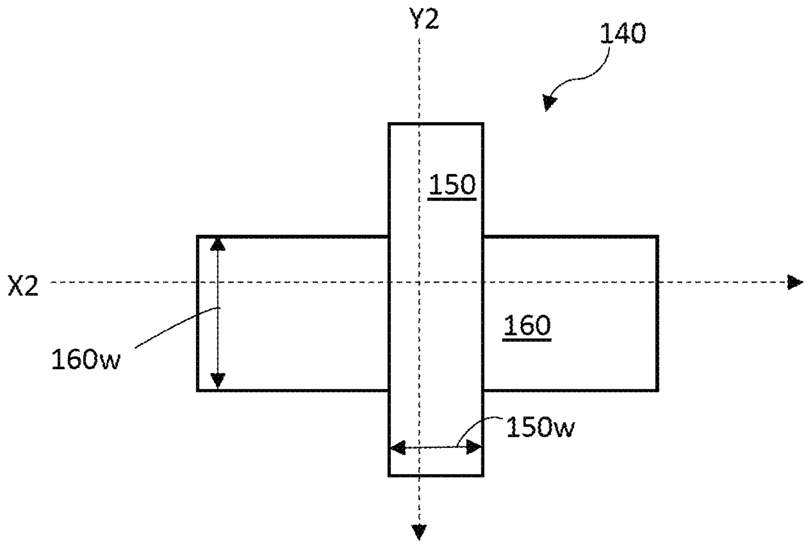

Referring to FIGS. 1A and 1B, a top-down layout of thick gate dielectric transistor 110 suitable for I/O devices and the thin gate dielectric transistor 140 suitable for logic devices is shown. Each transistor has gate regions 120 and 150 running in the Y direction which have a corresponding width of 120*w* and 150*w*. In some embodiments, the width 120*w* of the thick gate dielectric transistor is from 30 nm to 300 nm, the width 150*w* of the thin gate dielectric transistor is from 10 nm to 300 nm. Perpendicular to their respective gates 120/150, in the X direction each transistor 110/140 has source drain regions 130 and 160, respectively. In some embodiments, the width 130*w* of the source drain region 130 of the thick dielectric transistor 110 is less than the width 160*w* of the source drain region 160 of the thin gate dielectric transistor 140. In some embodiments, the width 130*w* of the source drain region 130 of the thick gate dielectric transistor 110 is from 5 nm to 30 nm, the width 160*w* of the source drain region 160 of the thin gate dielectric transistor 140 from 5 nm to 50 nm.

Figure 2A:
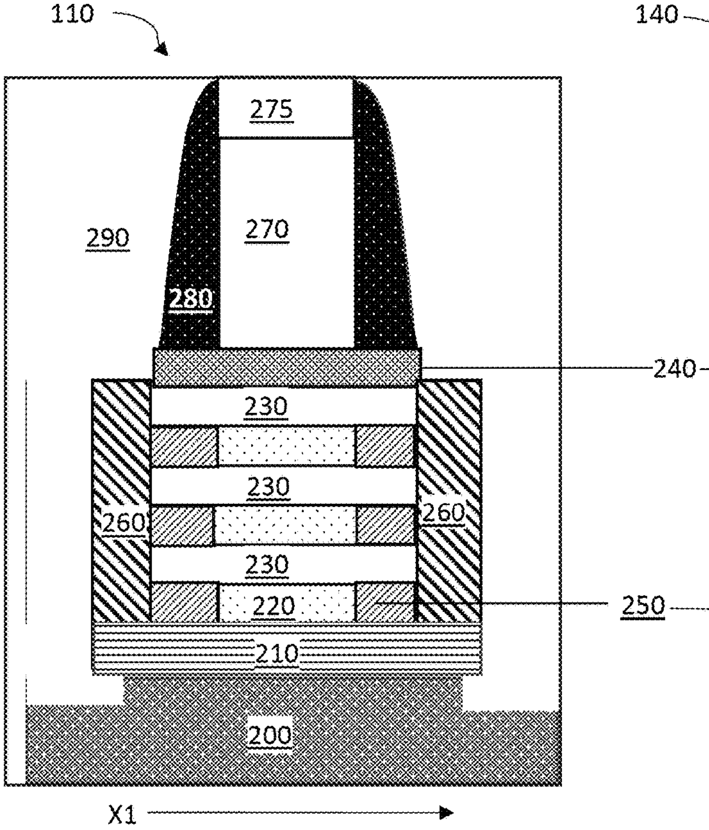
FIGS. 2A-2D are cross-sectional views taken along lines X1, Y1, X2 and Y2, respectively, in the structures of FIGS. 1A and 1B at a starting point in an exemplary method of making the semiconductor structure in accordance with an aspect of the invention.
Figure 2C:
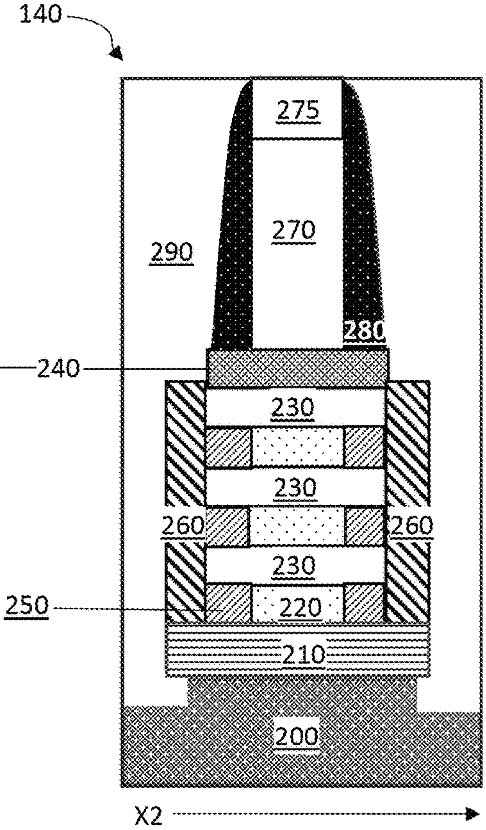
Figure 2B:
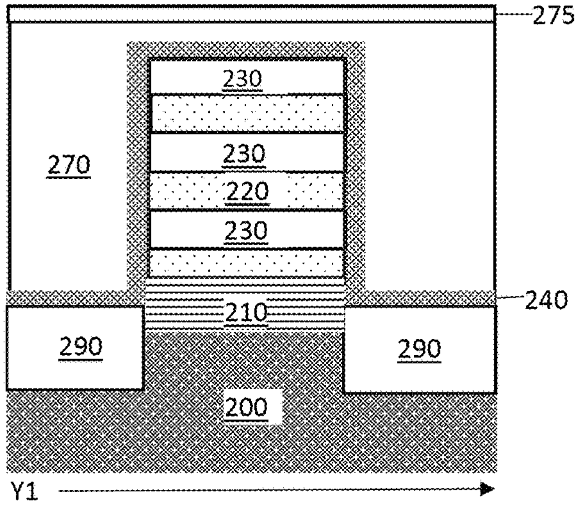
Figure 2D:
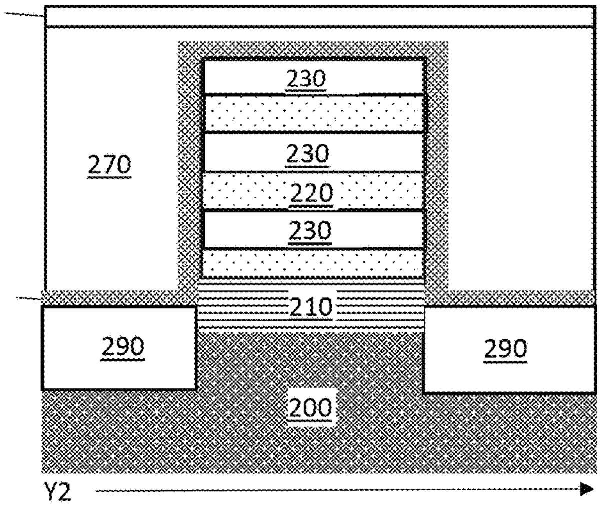

Referring to FIGS. 2A-2B, show a cross-section of the thick gate dielectric transistor 110 taken along the X1 and Y1 directions, respectively, at a starting point in making aspects of the invention. Similarly, FIGS. 2C-2D show a cross-section of the thin gate dielectric transistor 140 taken along the X2 and Y2 directions, respectively. At this starting point of the method, materials in each transistor are the same; therefore, explanations are made with respect to thick gate dielectric transistor 110 with the knowledge that the same explanation applies to analogous structures in the thin gate dielectric transistor 140 of FIGS. 2C and 2D.

Still referring to FIGS. 2A-2B, the transistor is on a substrate 200, preferably including silicon. Above the substrate may be a bottom dielectric 210 layer, which may be silicon nitride. In some embodiments, there is no bottom dielectric 210 layer. Resting above the bottom dielectric 210 layer is an alternating stack of patterned sacrificial material 220 and nanosheets 230. Preferably sacrificial material 220 may be SiGe while nanosheets 230 may be silicon. The figures show an embodiment with three groups of nanosheets 230 in the alternating stack, namely the upper (closest to the top dielectric 240), middle (adjacent the upper and lower nanosheets 230), and lower (closest to the substrate 200). Advantageously, there are two are more groups of nanosheets per stack. While the thick and thin gate dielectric transistors 110/140 may have a different number of groups of nanosheets 230 per stack, advantageously they have the same number (as shown in the embodiment in the figures). Now referring to FIG. 2A which depicts a cross-section taken in the X1-direction along source drain region 130 (seen in FIG. 1A), on top of the alternating stack is a dummy gate 270 having sidewall spacers 280 and a dummy gate cap 275. The dummy gate may be amorphous silicon while the spacers 280 may be, for example, SiN, SiOC, SiBCN, or SiOCN. The dummy gate cap 275 may be SiN. An isolation 290 layer, preferably a silicon oxide based film, is co-planar with the dummy gate cap 275.

Continuing with FIG. 2A and referring to the alternating stack of sacrificial material 220 and nanosheets 230, the sacrificial material 220 is recessed to undercut the nanosheets 230. Inner spacers 250 fill the recesses. Inner spacers 250 may be, for example, SiN, SiBCN, SiOCN, or SiOC. On either side of the alternating stack and gate spacers 280 are source drains 260, which may be epitaxially grown silicon which may be doped by one or more methods.

Moving to FIG. 2B which depicts a cross-section taken in the Y1-direction along the gate 120 and referring to the alternating stack of sacrificial material 220 and nanosheets 230, in the substrate 200 on either side of the stack are isolation 290 layers. Above isolation 290 layers and the stack is the top dielectric 240 layer, which is then covered by dummy gate 270 material and dummy gate cap 275.

Figure 3A:
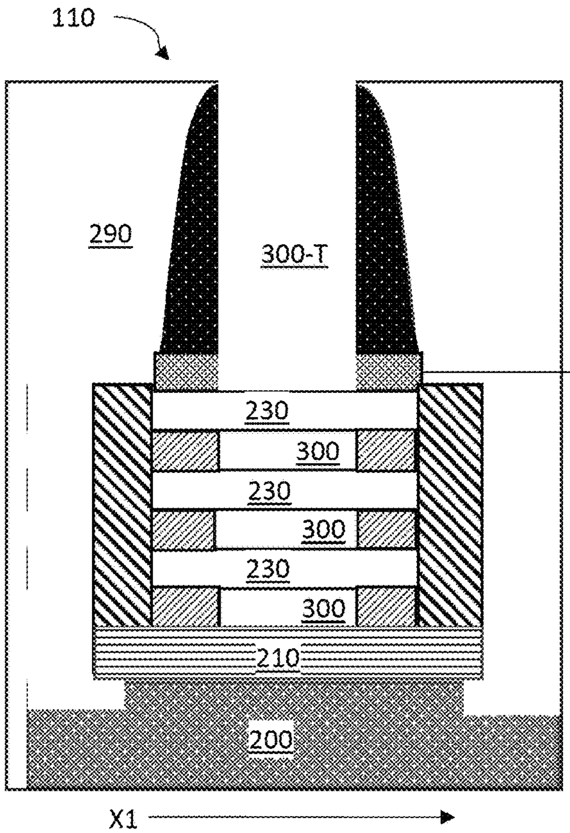
FIGS. 3A-3D are cross-sectional views of the structures of FIGS. 2A-2D after removing a dummy gate in the first transistor, in accordance with an aspect of the invention.
Figure 3C:
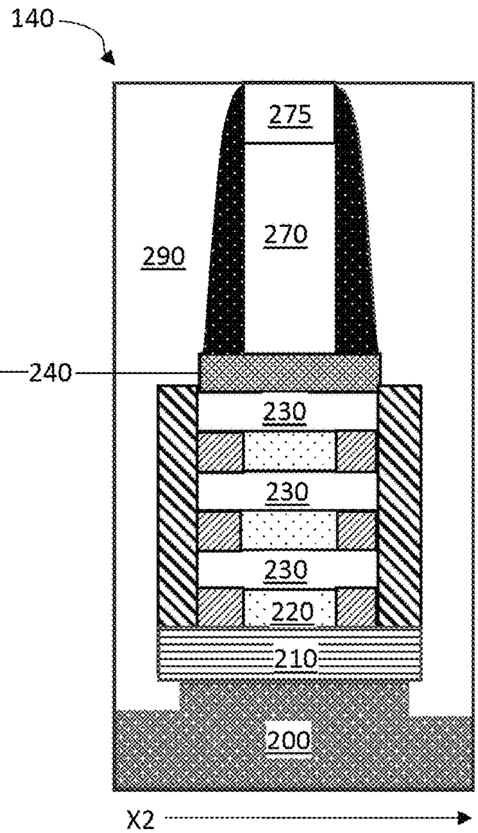
Figure 3B:
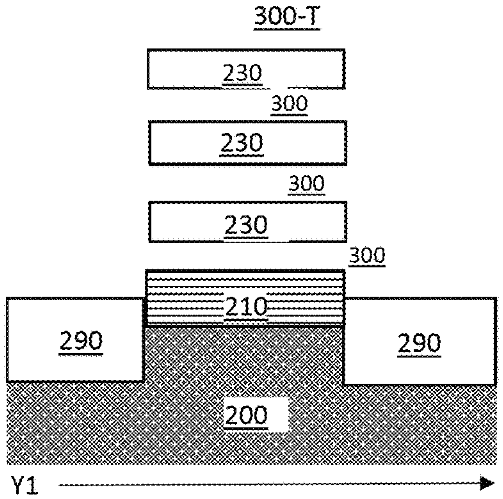
Figure 3D:
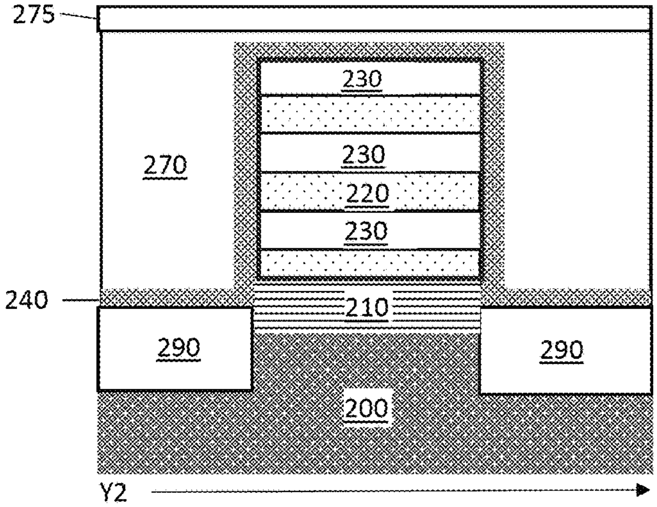

In FIGS. 3A-3D show the structures of FIGS. 2A-2D after removing the dummy gate cap 275, dummy gate 270 material, top dielectric 240, and the sacrificial material 220 portions of the alternating stack from the thick gate dielectric transistor 110 to form cavities 300. The cavities 300 are between adjacent nanosheets (FIGS. 3A and 3B). The cavities 300 above an upper nanosheet and between gate spacers 280 form a gate trench 300-T. Note, the thin gate dielectric transistor 140 is masked (not shown) and remains unchanged.

Figure 4A:
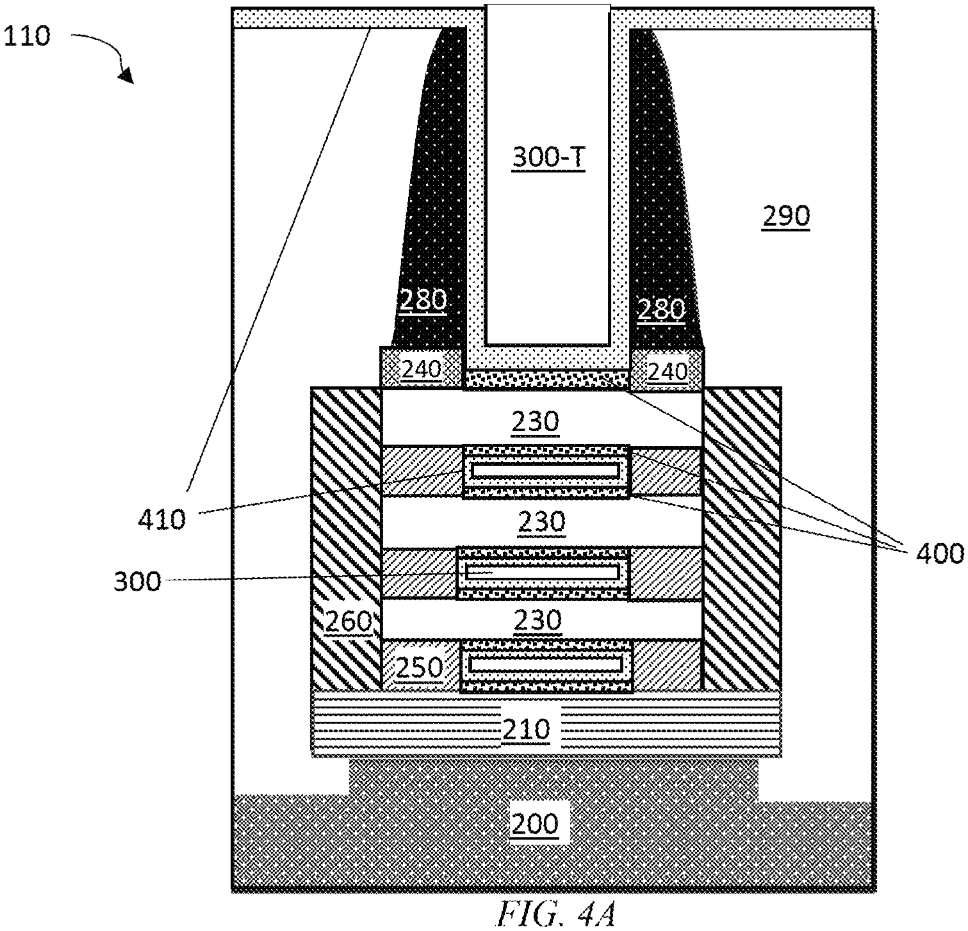
FIGS. 4A-4D are cross-sectional views of the structures of FIGS. 3A-3D after forming a thick gate dielectric and a first high-k material in the first transistor, in accordance with an aspect of the invention.
Figure 4B:
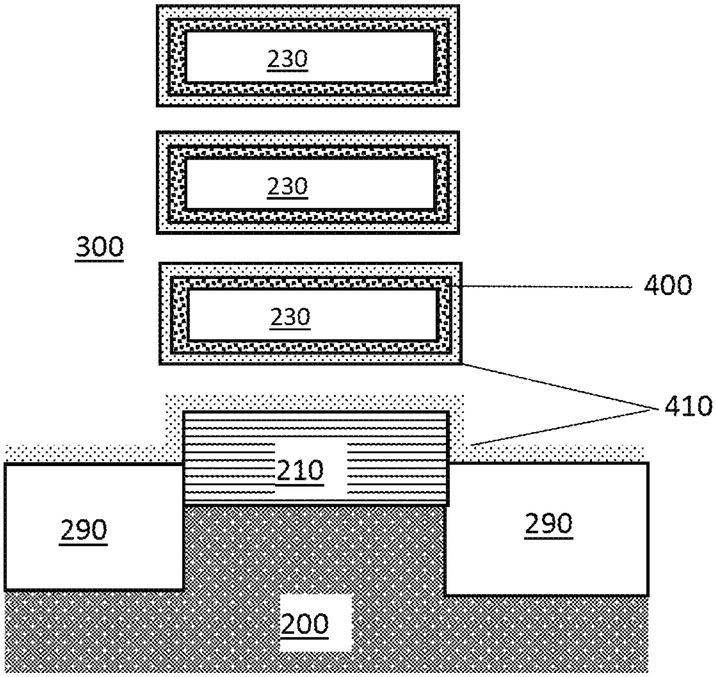
Figure 4C:
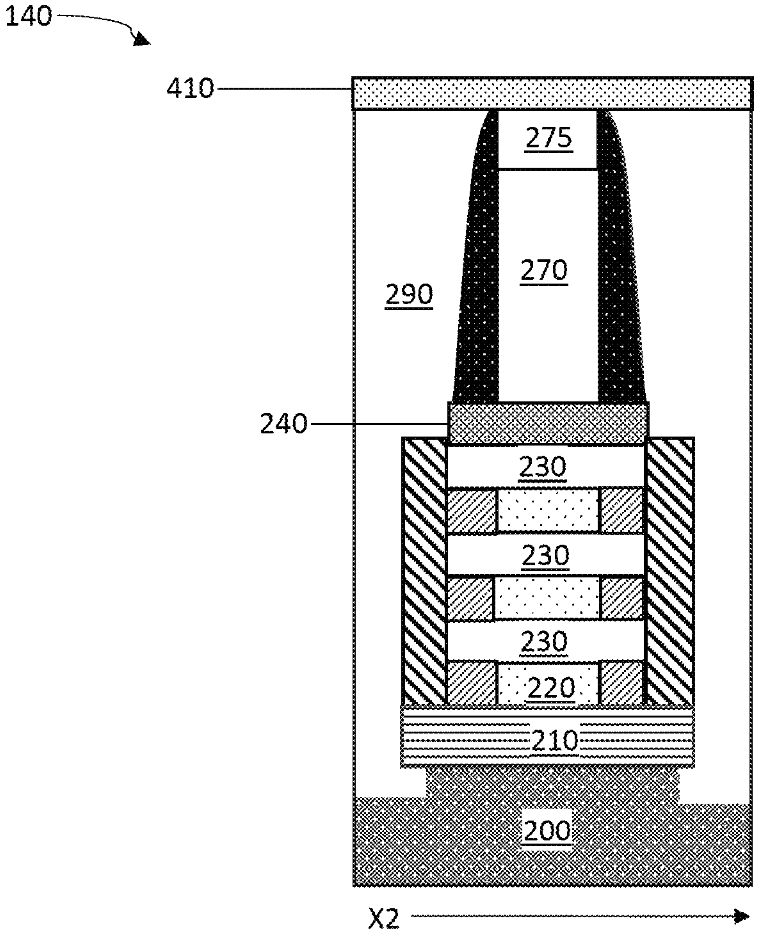
Figure 4D:
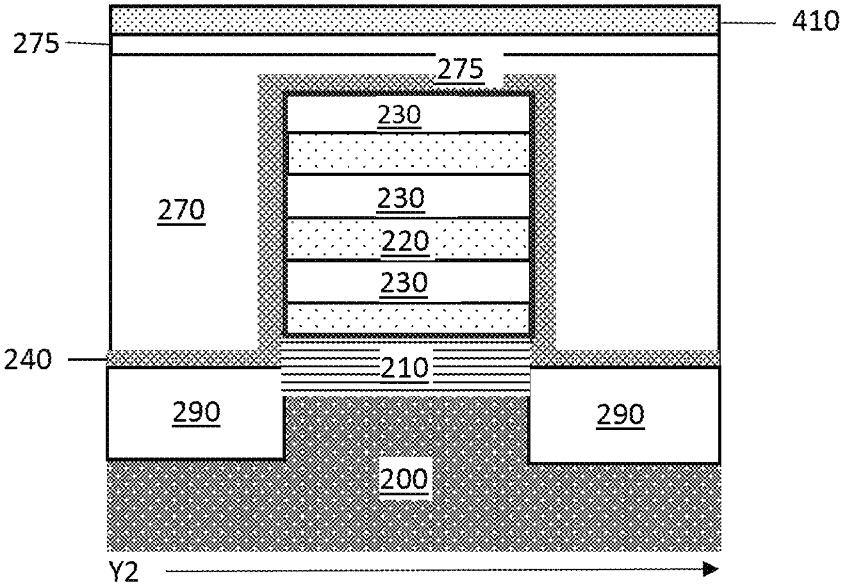

Referring to FIGS. 4A-4B, which show the structures of FIGS. 3A-3B after forming a thick gate dielectric 400 and first high-k dielectric 410 in the cavities 300 and gate trench 300-T of the thick gate dielectric transistor 110. In the embodiment show in FIGS. 4A-4B, the thick gate dielectric 400 is formed on the nanosheet 230 surfaces exposed to the cavity 300 and gate trench 300-T. Thick gate dielectric 400 may be a $SiO_2$ film, a SiN film or any combination of those films. The thickness of the thick gate dielectric 400 in a completed structure may be about 0.5 nm to about 3 nm, and preferably 1 nm to 2 nm. Referring to FIG. 4A, the first high-k dielectric 410 creates a u-shaped region in the cavity between gate spacers 280 and above thick gate dielectric 400 (i.e. in the gate trench 300-T). Referring to FIG. 4B, in the alternating stack, the first high-k dielectric 410 wraps the nanosheets 230 having intervening thick gate dielectric 400. In addition, the first high-k dielectric 410 conforms to the isolation 290 layer and bottom dielectric 210 layer on the substrate 200. The first high-k dielectric may be hafnium oxide or other suitable materials including $ZrO_2$, $HfZrO_2$, $HfLaO_2$, $HfSiO_2$, $HfAlO_2$ FIGS. 4C-4D show the structures of FIGS. 3C-3D after forming a thick gate dielectric 400 and first high-k dielectric 410. Here, the thin gate dielectric transistor 140 was unmasked to receive the first high-k dielectric 410 material deposition over its planar surface. If thicker gate dielectric 400 is formed selectively only on Si nanosheet by the process such as thermal oxidation, there is no thicker gate dielectric 400 formed on the thin gate dielectric transistor 140.

FIGS. 5A-5D show the structures of FIGS. 4A-4D after forming a reliability TiN 500 film and a polysilicon fill 510 in the cavities 300 and gate trench 300-T of the thick gate dielectric transistor 110 and on top surfaces of the thin gate dielectric transistor 140.

Figure 6A:
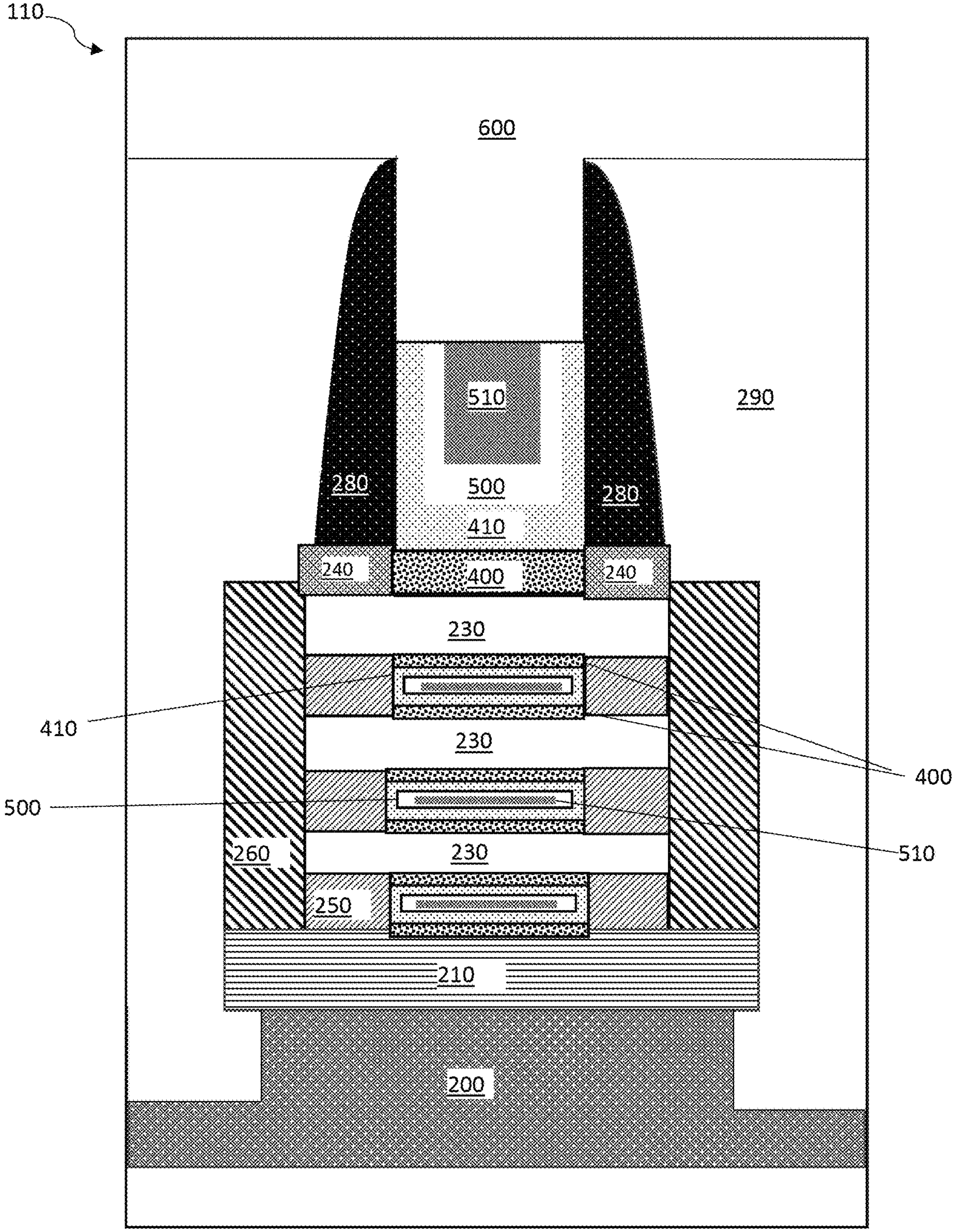
FIGS. 6A-6D are cross-sectional views of the structures of FIGS. 5A-5D after recessing the first high-k material, reliability titanium nitride and polysilicon fill material in the first transistor in the first transistor and masking the first transistor, in accordance with an aspect of the invention.
Figure 6B:
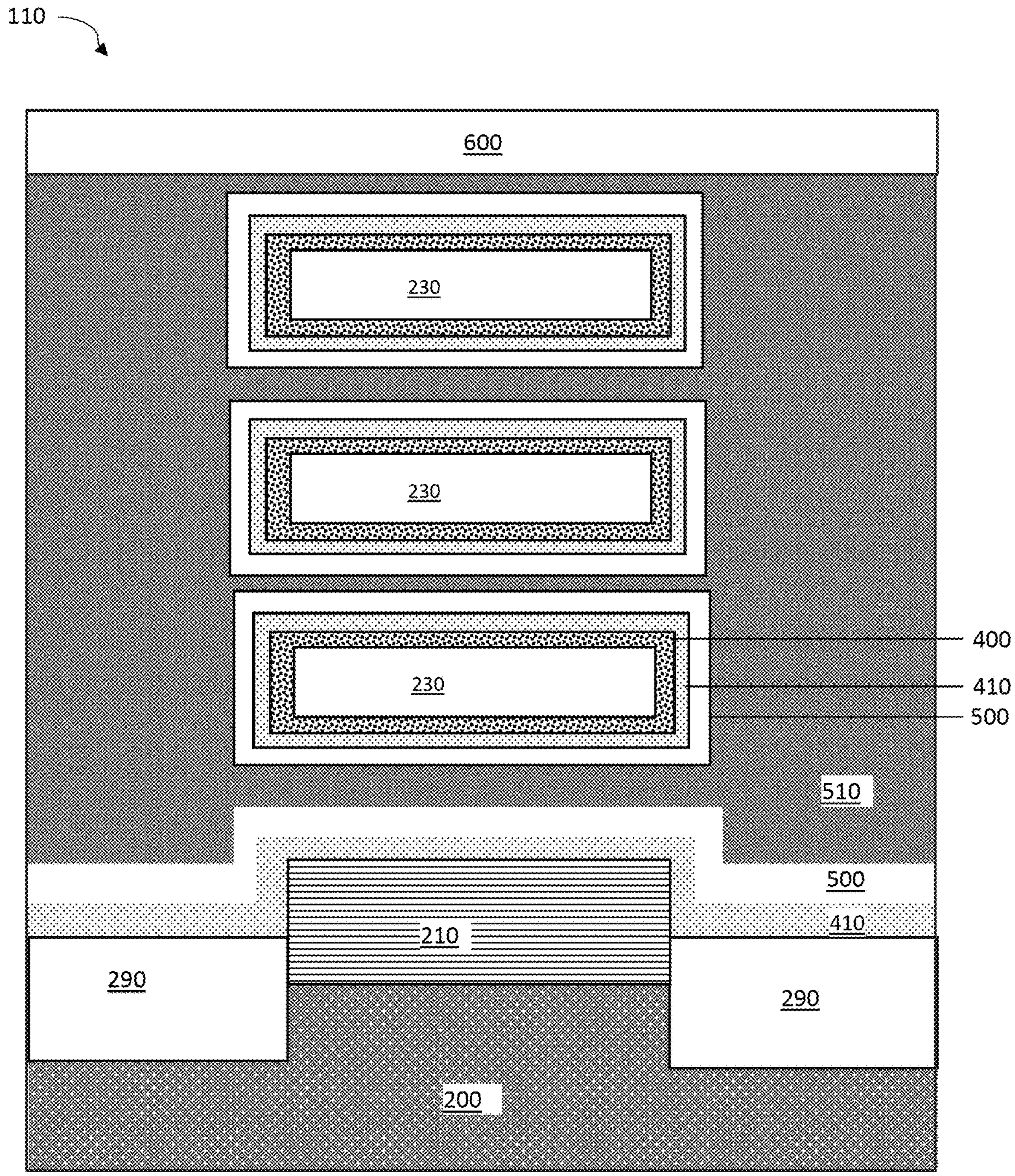
Figure 6C:
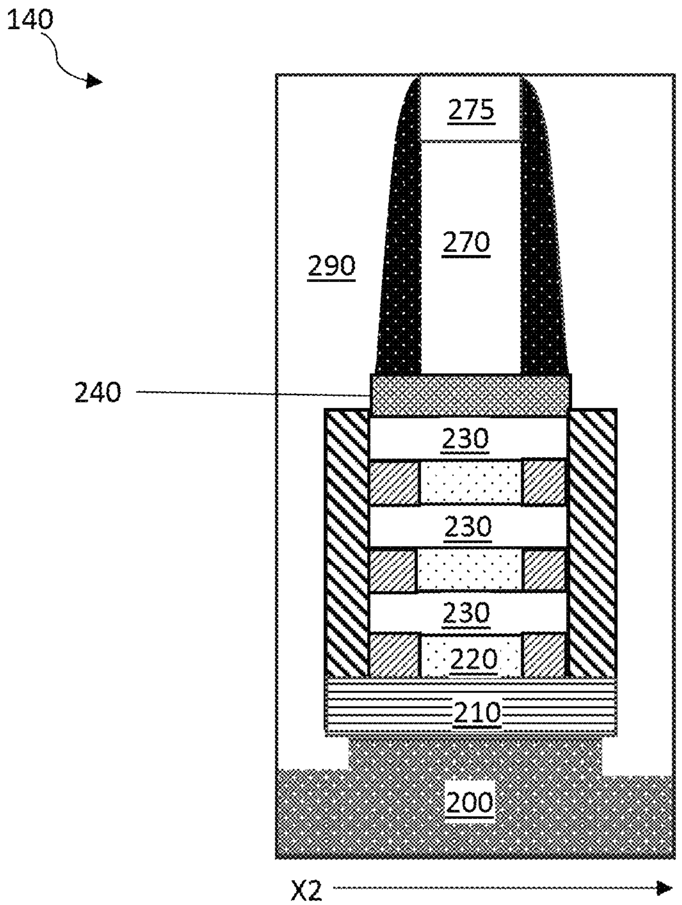
Figure 6D:
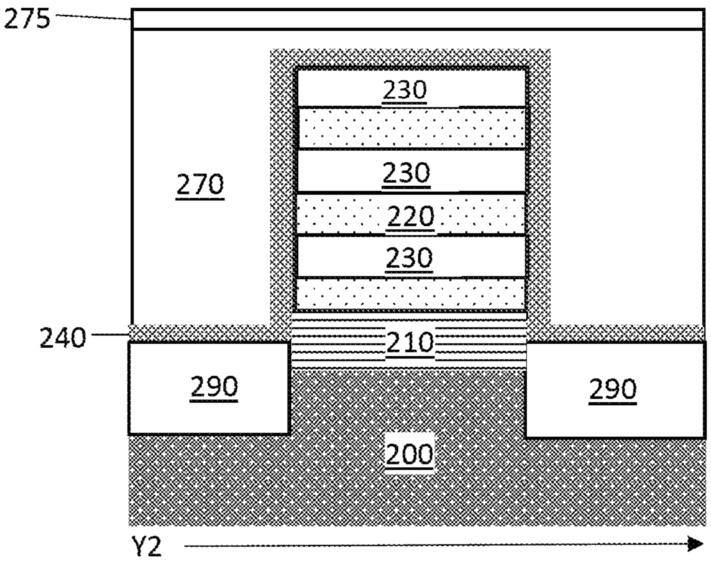

In FIGS. 6A-6D the first high-k dielectric 410, polysilicon fill 510 and reliability TiN 500 are recessed in the gate area of the thick gate dielectric transistor 110 to a level roughly midway down the gate spacers 280 (see FIG. 6A). The recessing process can also remove metal contamination from metal nitride and $HfO_2$ in the downstream such as thin gate dielectric transistor 140. In the same transistor, the reliability TiN 500 and polysilicon fill 510 remain between the nanosheets (see FIG. 6B). In the thin gate dielectric transistor 140, the reliability TiN 500 and polysilicon fill 510 are removed from top surfaces as is the first high-k dielectric 410. Subsequent to the removal, one or more mask 600 layers are formed over the thick gate dielectric transistor 110 (FIGS. 6A-B) while the thin gate dielectric transistor 140 remains unmasked (FIGS. 6C-D).

FIGS. 7A-7D show the structures of FIGS. 6A-6D after removing the dummy gate cap 275, dummy gate 270 material, top dielectric 240, and the sacrificial material 220 portions of the alternating stack from the thin gate dielectric transistor 140 to form cavities 300 and gate trench 300-T. Note, the thick gate dielectric transistor 110 is masked and, therefore, FIGS. 7A and 7B remain unchanged from FIGS. 6A and 6B. At this stage, the structure is not "floating" despite the appearance in FIG. 7D—all the nanosheets are supported elsewhere by the source drains 260, so they are stable.

Figure 7A:
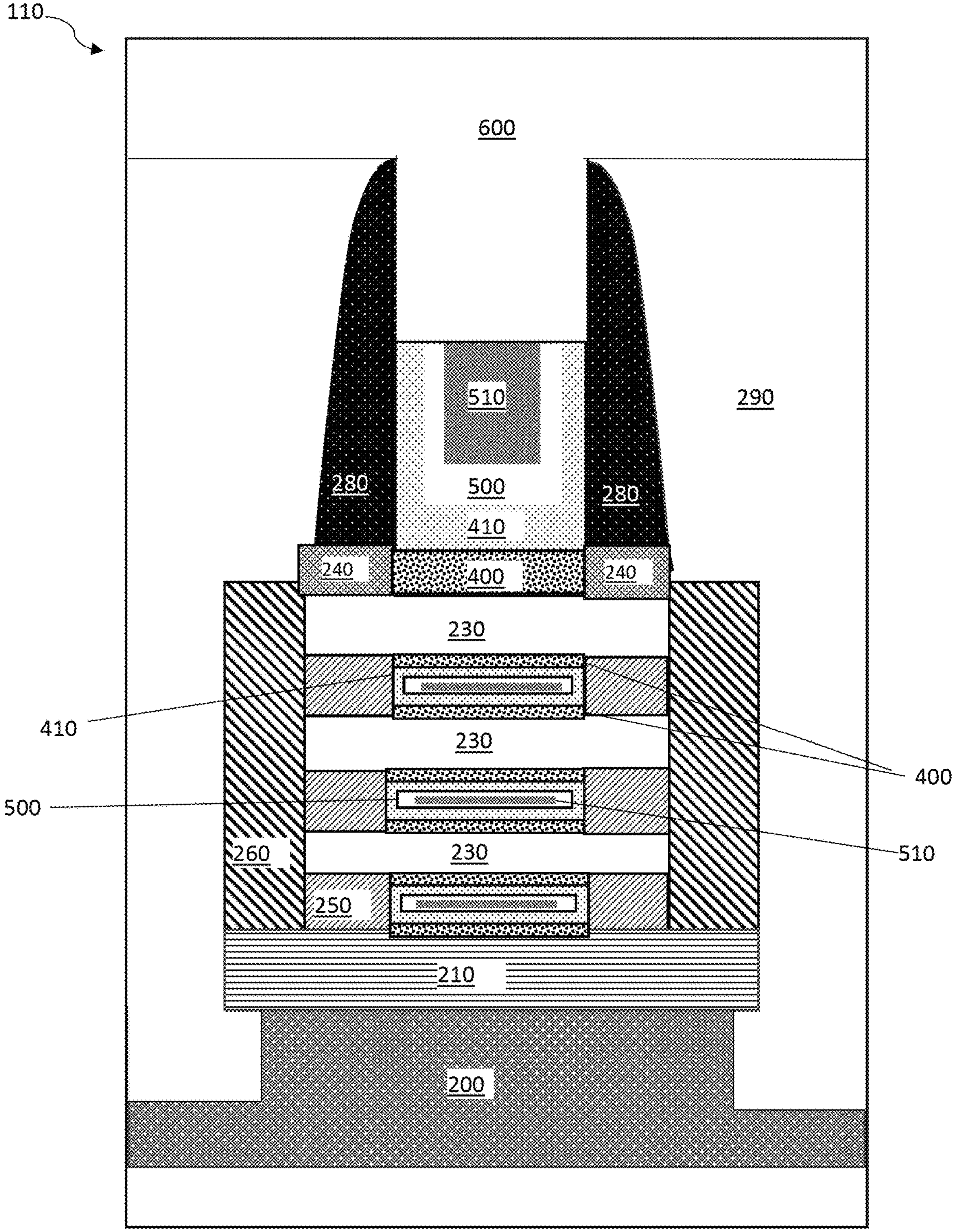
FIGS. 7A-7D are cross-sectional views of the structures of FIGS. 6A-6D after removing a dummy gate in the second transistor, in accordance with an aspect of the invention.
Figure 7B:
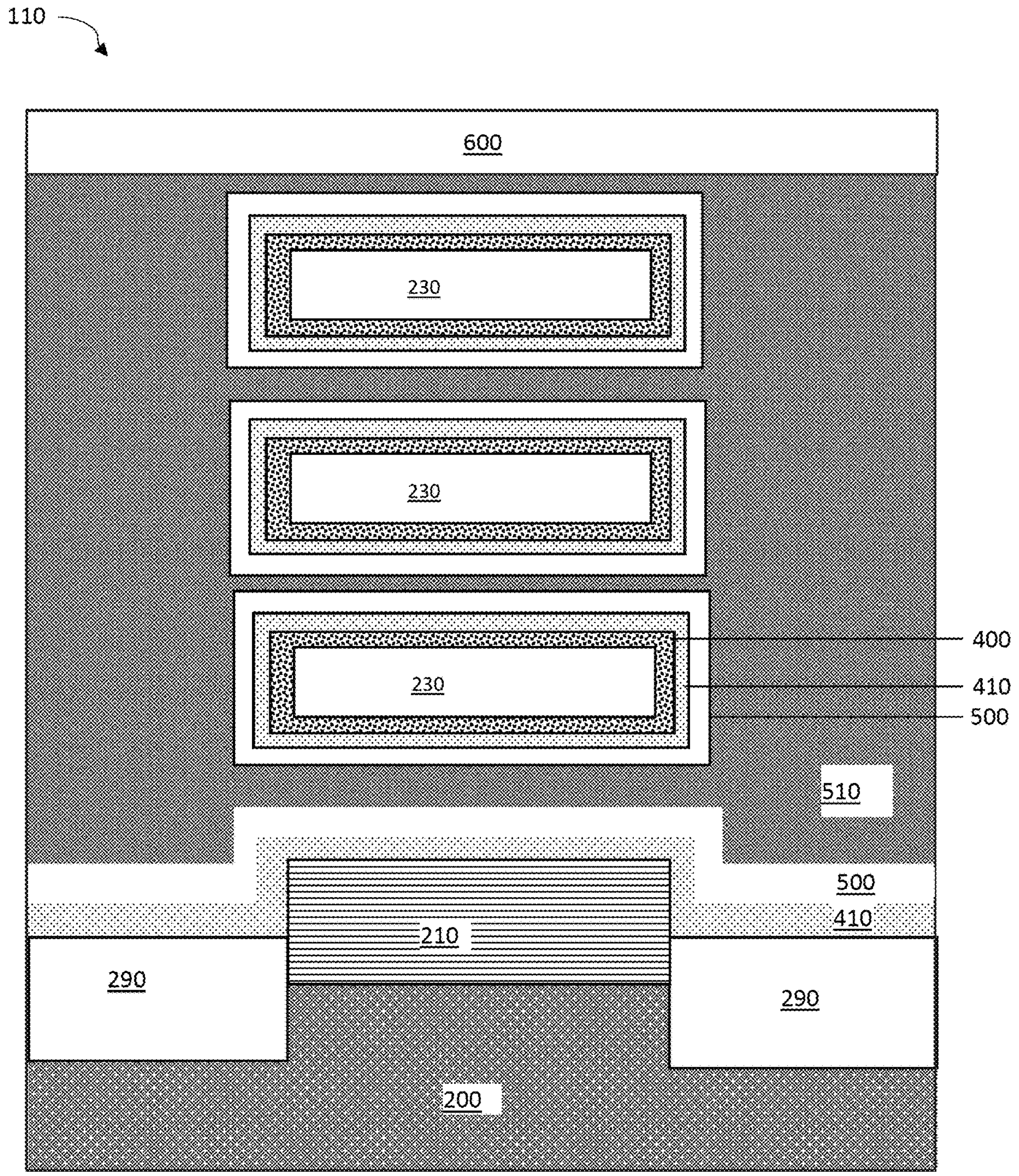
Figure 7C:
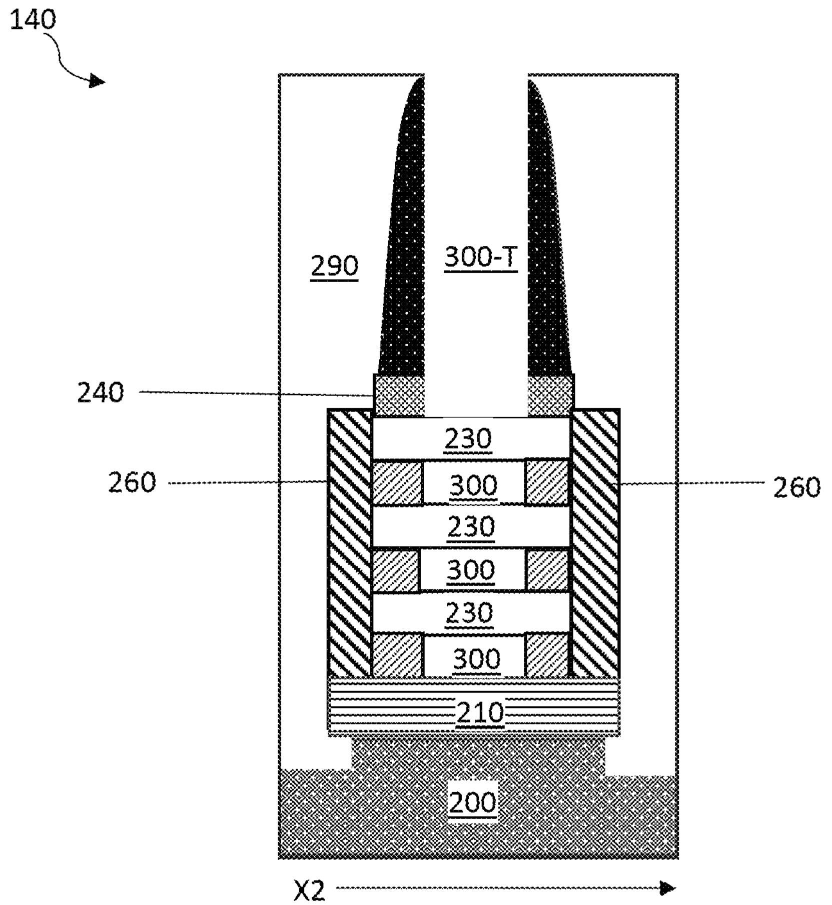
Figure 7D:
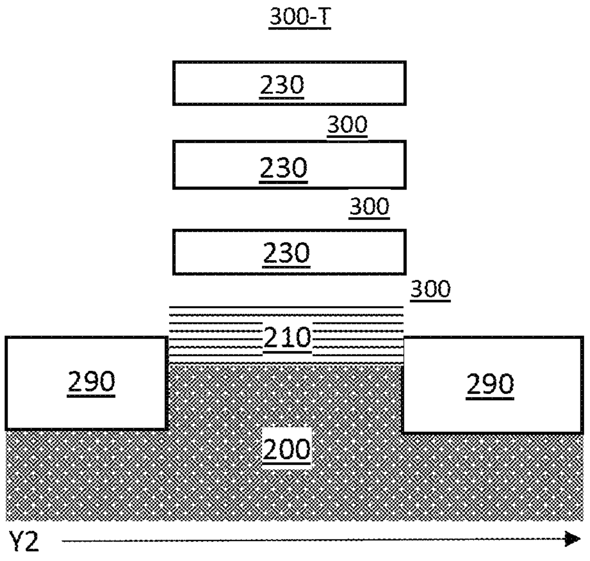
Figure 8A:
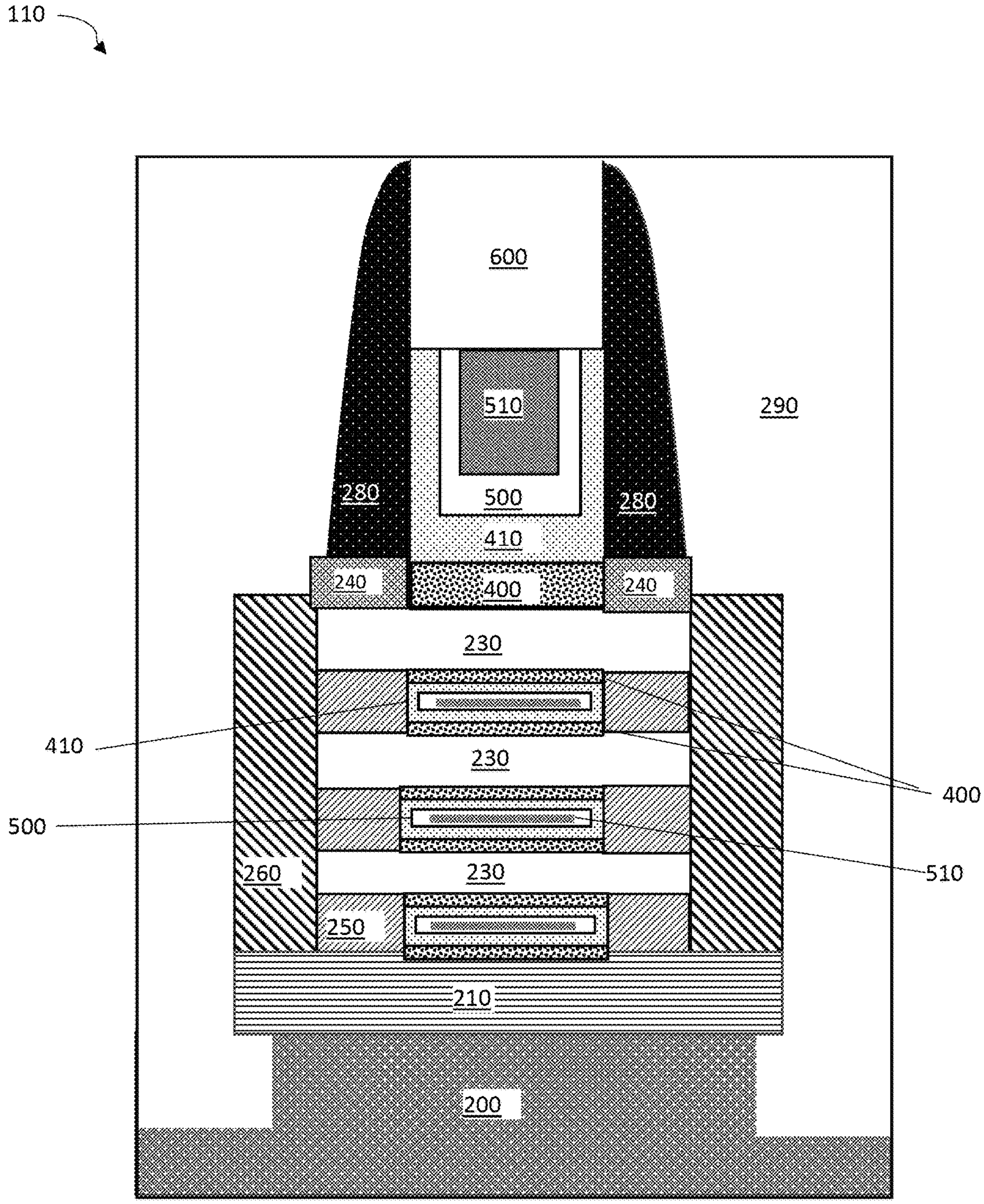
FIGS. 8A-8D are cross-sectional views of the structures of FIGS. 6A-6B and FIGS. 7C-7D after forming a thin gate dielectric. a second high-k material, a reliability titanium nitride and a polysilicon fill material in the first transistor and planarizing the first and second transistors, in accordance with an aspect of the invention.
Figure 8B:
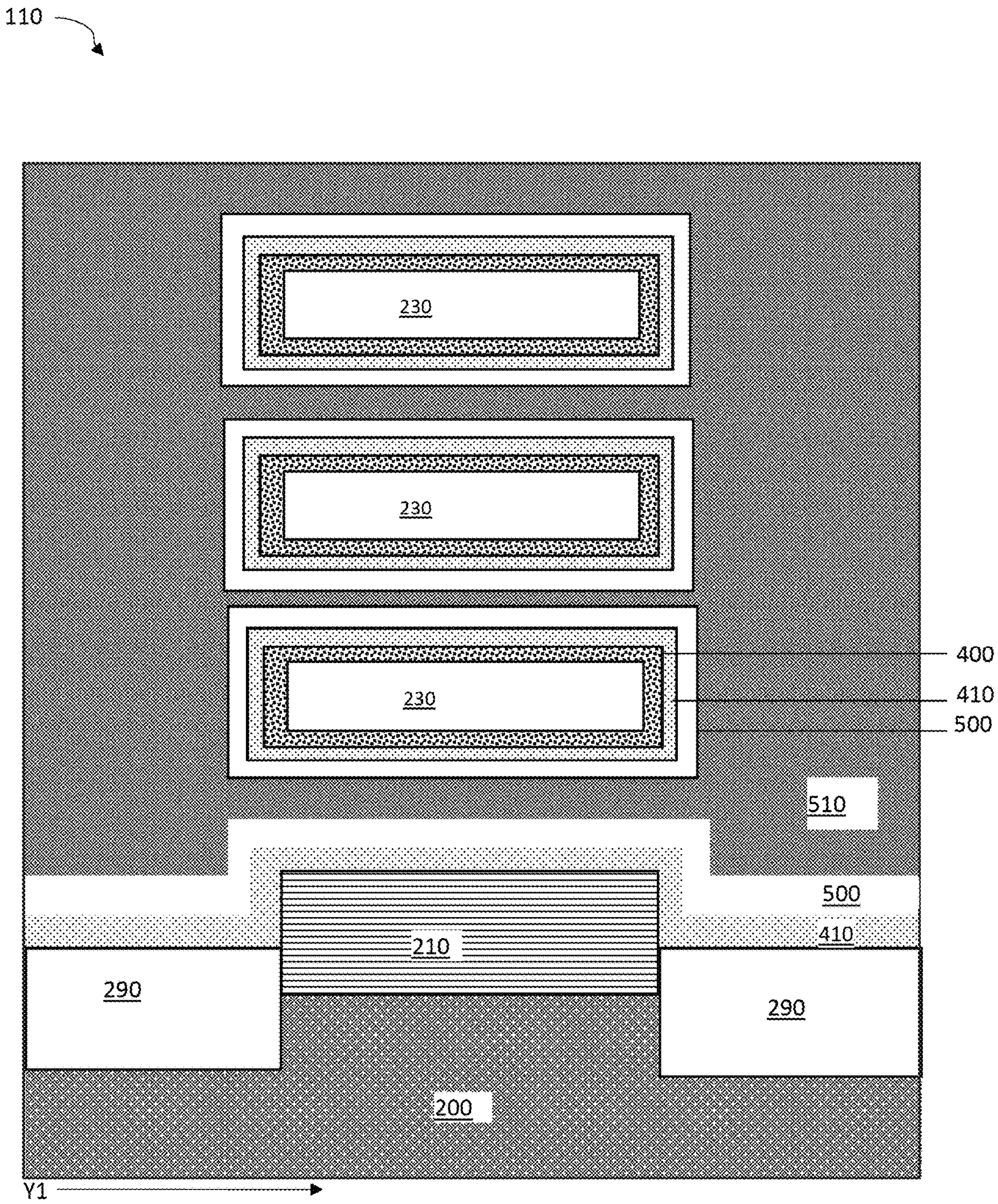
Figure 8C:
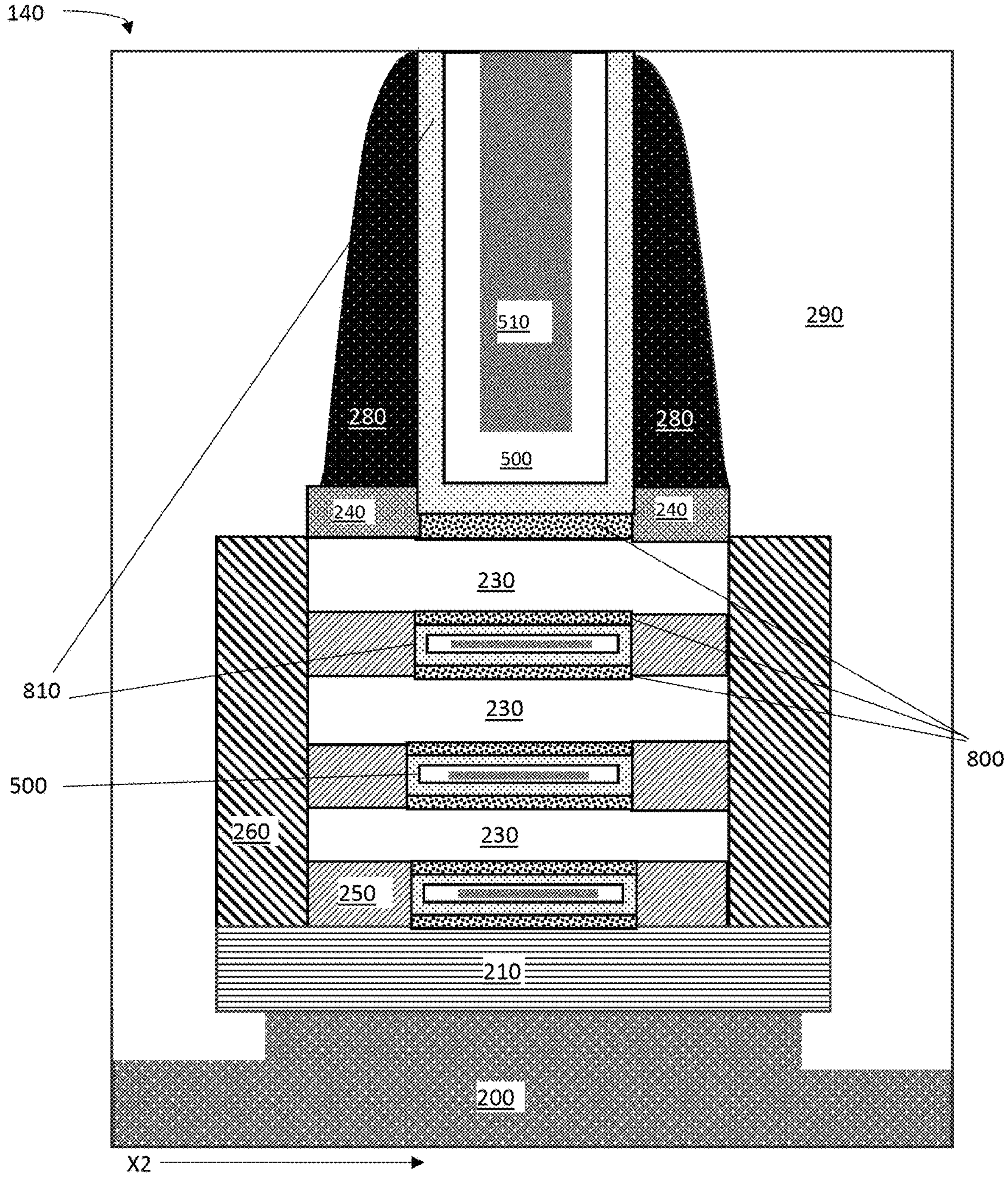
Figure 8D:
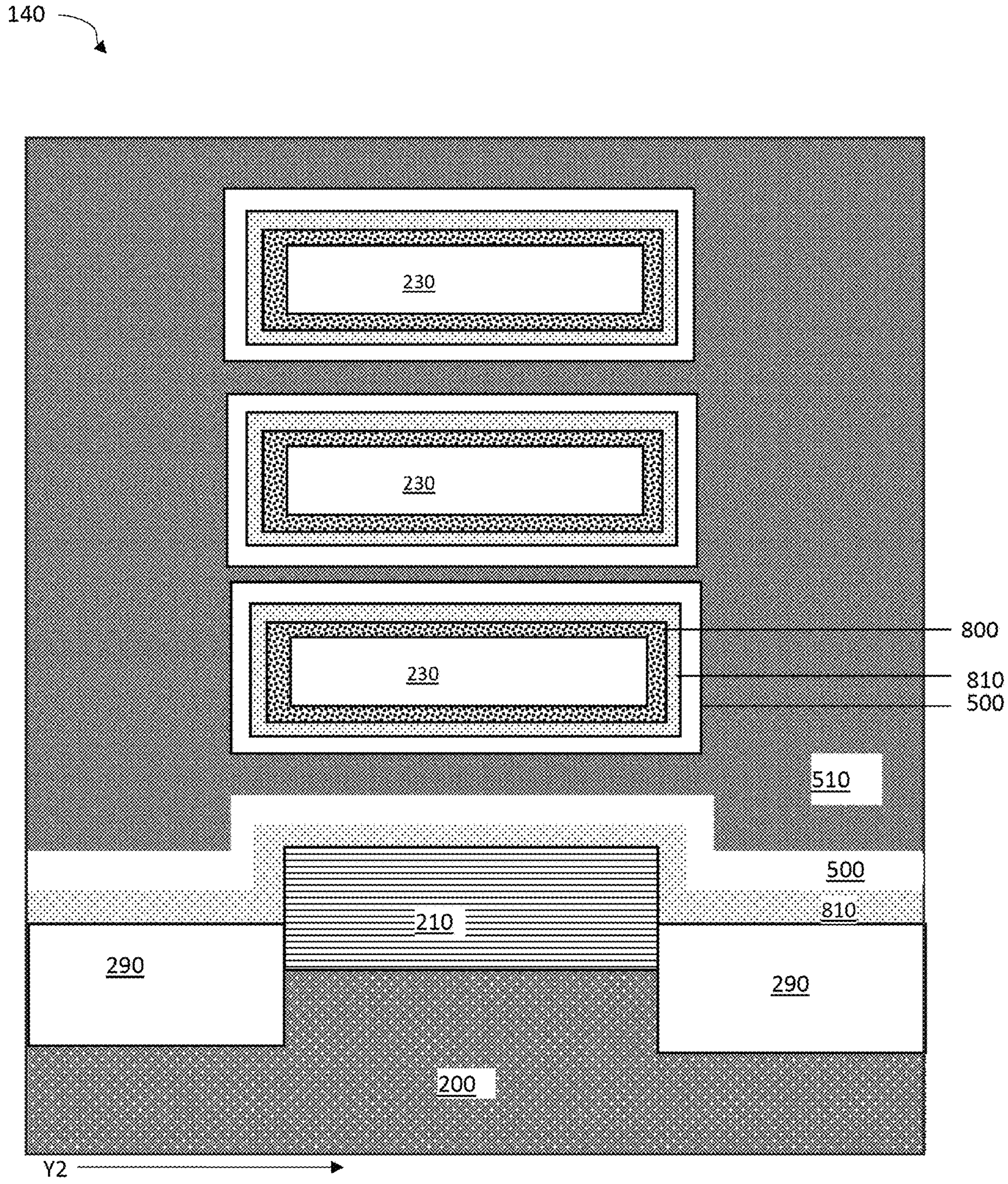

Refer now to FIGS. 8C-8D (FIGS. 8A and 8B are discussed below), which show the structures of FIGS. 7C-7D after forming a thin gate dielectric 800 and second high-k dielectric 810 in the cavities 300 and gate trench 300-T of the thin gate dielectric transistor 140. In addition, reliability TiN 500 and polysilicon fill 510 are also formed in the thin transistors 140. After poly fill, both transistors are planarized to the top of the gate spacers 280 as shown in FIGS. 8A-8D. Advantageously, while the reliability TiN 500 film is in place on both transistors, the substrate may be annealed after planarization.

In the aspect depicted in FIGS. 8C-8D, the thin gate dielectric 800 is formed on the nanosheet 230 surfaces exposed to the cavity 300 and gate trench 300-T. Thin gate dielectric 800 may be a $SiO_2$ film, a SiN film or any combination of those films. The thickness of the thin gate dielectric 800 may be about 0.5 nm to about 1.5 nm, and preferably 0.7 nm to about 1 nm. Referring to FIG. 8C, the second high-k dielectric 810 creates a u-shaped region in the cavity between gate spacers 280 and above thin gate dielectric 800 (i.e. in the gate trench 300-T). Referring to FIG. 8D, in the alternating stack, the second high-k dielectric 810 wraps the nanosheets 230 having intervening thin gate dielectric 800, and conforms to the isolation 290 layer and bottom dielectric 210 layer on the substrate 200. The second high-k dielectric 810 may be hafnium oxide or other suitable materials including $ZrO_2$, $HfZrO_2$, $HfLaO_2$, $HfSiO_2$, $HfAlO_2$. The first high-k dielectric 410 and second high-k dielectric 810 can be the same material with the same thickness, can be the same material with different thicknesses, or can be different materials with different thicknesses.

Referring to FIGS. 9A-9D which show the structures of FIGS. 8A-8D after removing various gate fill materials down to the first high-k dielectric 410 and second high-k dielectric 810 and forming metal gates in both transistors. However, in some embodiments, the reliability TiN 500 can be kept in place. Here, metal gates include the work function ("WF") material 900 and metal gate fill 910. The WF material 900 may be metal nitride such as TiN, WN, as well as Ti or Al contained alloys metals such as TiAlC, TiAl, AlC, Ti, Al, and others. Thin and thick gate dielectric transistors of the same polarity (i.e. both NFET or both PFET) can have the same WF material 900, but transistors of opposite polarity can have WF materials 900 different from each other. Metal gate fill 910 may include one or more layers of aluminum, tungsten or other suitable conductor(s). Referring to FIGS. 9A-9D, the thick gate dielectric transistor's 110 gate includes both the WF material 900 and the metal gate fill 910. However, due to the smaller gate width 150*w* of the thin gate dielectric transistor 140, its gate may only contain the WF material 900 and no metal gate fill 910. As WF material 900 has higher resistance and is slower to deposit compared to metal gate fill 910, it is advantageous that the larger thick gate dielectric transistor 140 also have metal gate fill 910.

Figure 9A:
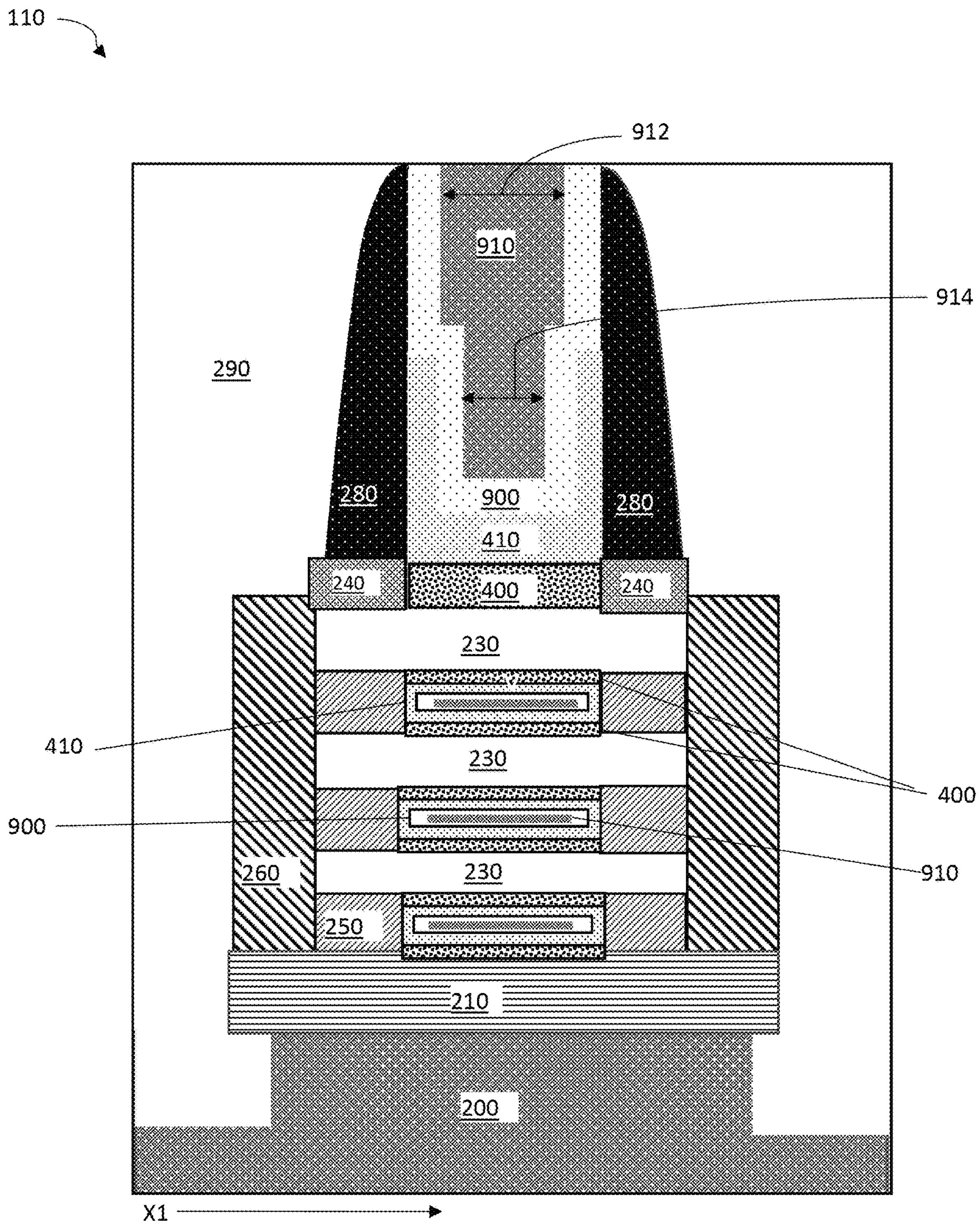
FIGS. 9A-9D are cross-sectional views of the structures of FIGS. 8A-8D, after removing reliability titanium nitride and a polysilicon fill material in both transistors and depositing a work function material and a metal gate fill, in accordance with an aspect of the invention.
Figure 9B:
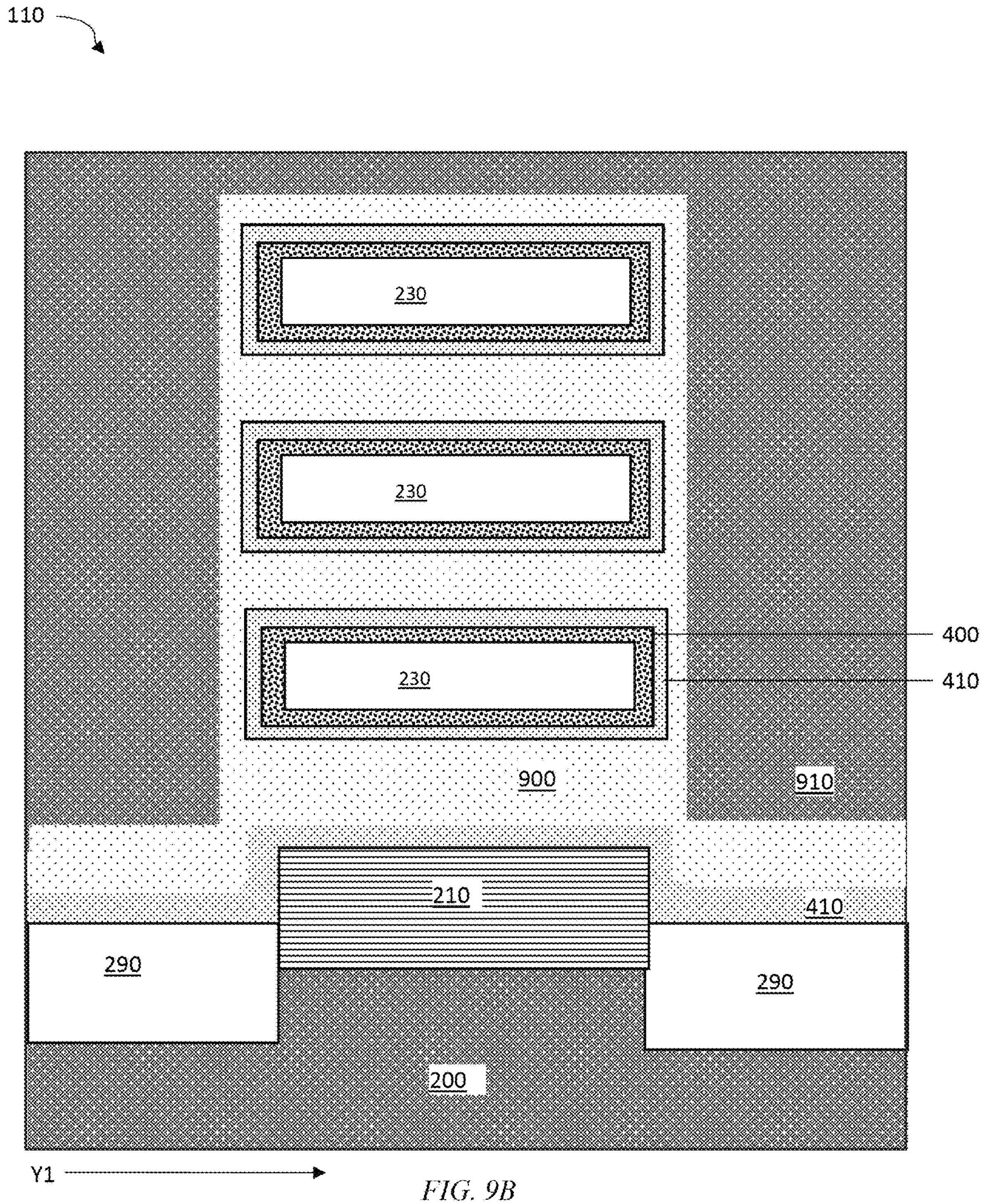
Figure 9C:
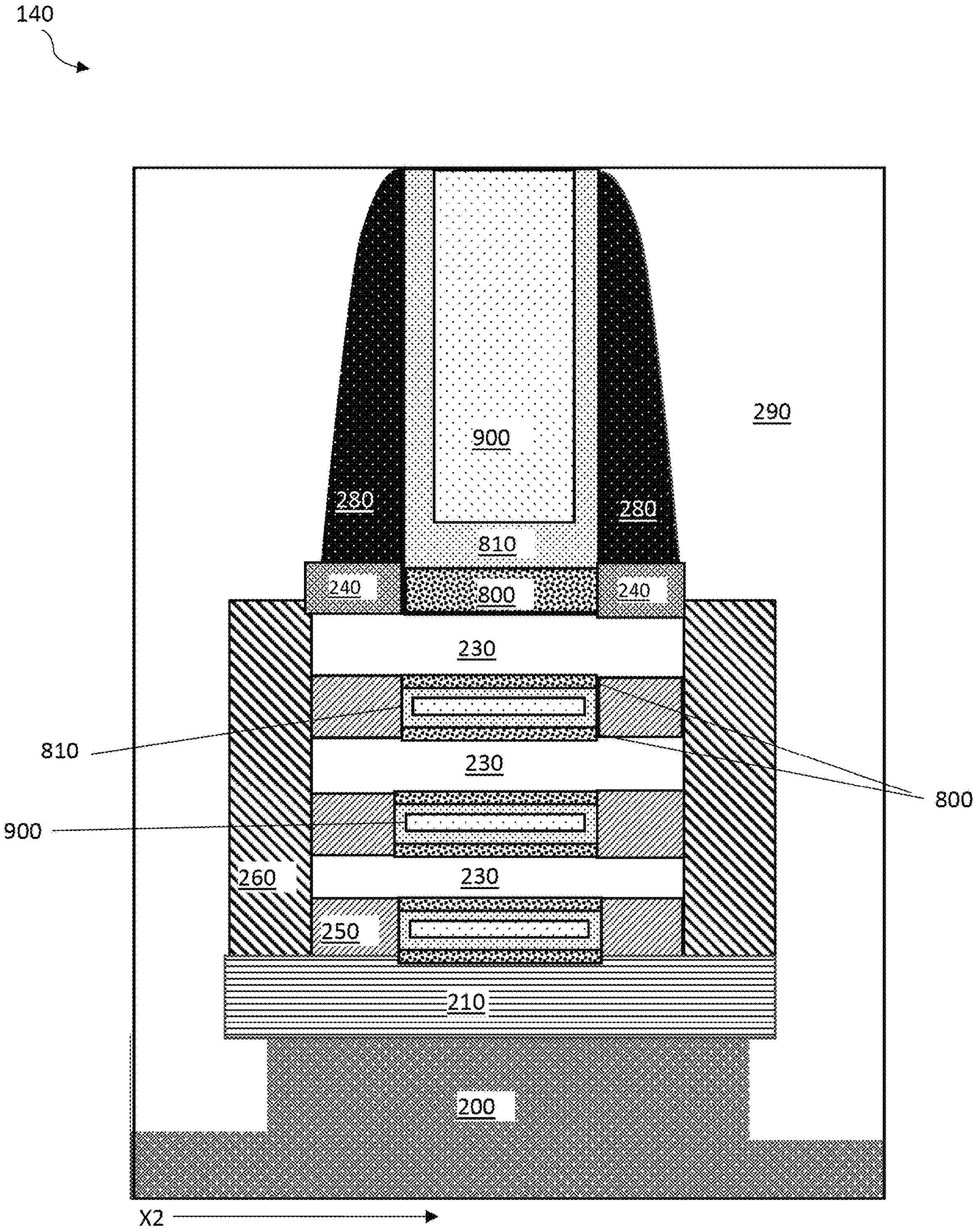
Figure 9D:
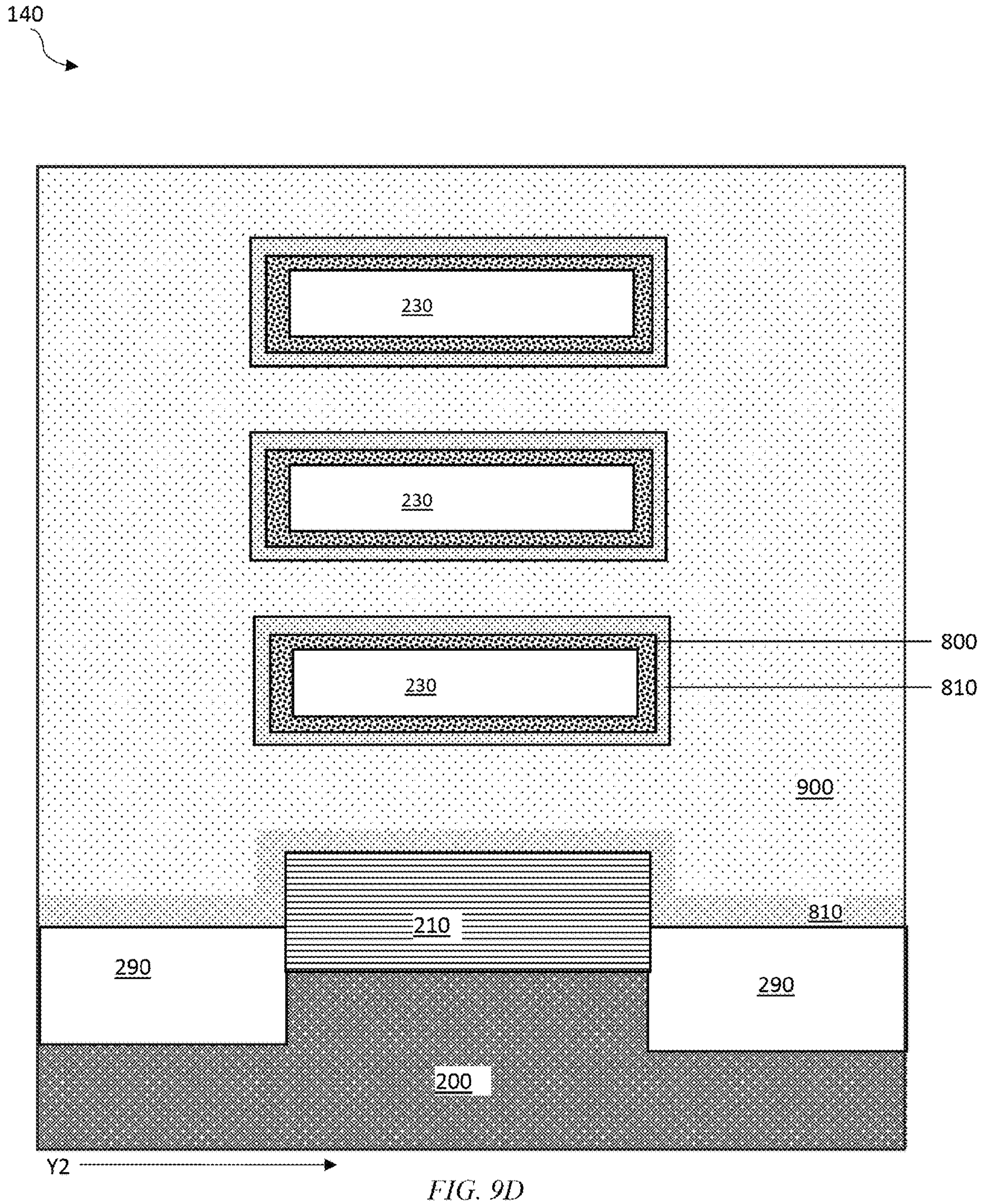

Referring to FIG. 9A, the cross-sections perpendicular to the gates of the thick gate dielectric transistors 110, note that due to the recessing of the first high-k dielectric 410, the largely conformal WF material 900 is either sandwiched by the metal gate fill 910 and gate spacer 280 at the top of the gate or by the metal gate fill 910 and the first high-k dielectric 410 at the bottom of the gate. Likewise, due to the first high-k dielectric 410 recessing, the metal gate fill 910 has two dimensions, a top dimension 912 and a bottom dimension 914 wherein the top dimension 912 is larger. Recessing the first high-k dielectric 410 and having more metal gate fill 910 advantageously reduces gate resistance. In contrast, referring to FIG. 9C showing an analogous view of the thin dielectric transistor 140, there is no recessing of the second high-k dielectric 810 material, and as a result, the WF material 900 is always in contact with the second high-k 810 regardless of location on the spacer 280 sidewall. It is worth noting that the thick gate dielectric being half way up the sidewall can help reduce gate resistance and help device performance, and that having more W or Al at the top of the gate can help reduce gate resistance.

Referring to FIGS. 10A-10D which show the structures of FIGS. 9A-9D after a metal gate cap 920 and contacts. Metal gate cap 920 is an insulating film, preferably SiN, lying between and co-planar with the gate spacers 280. Next one or more middle of line insulator layers 930 are deposited. Middle of line insulator layers 930 may be one or more of SiN, $SiO_2$, doped silicon-oxides or other suitable film or any combination thereof. Next, contacts 940 to the source/drains 260 and contacts 950 to the gate are made. FIGS. 10A-10D represent a completed structure of an embodiment.

Figure 5A:
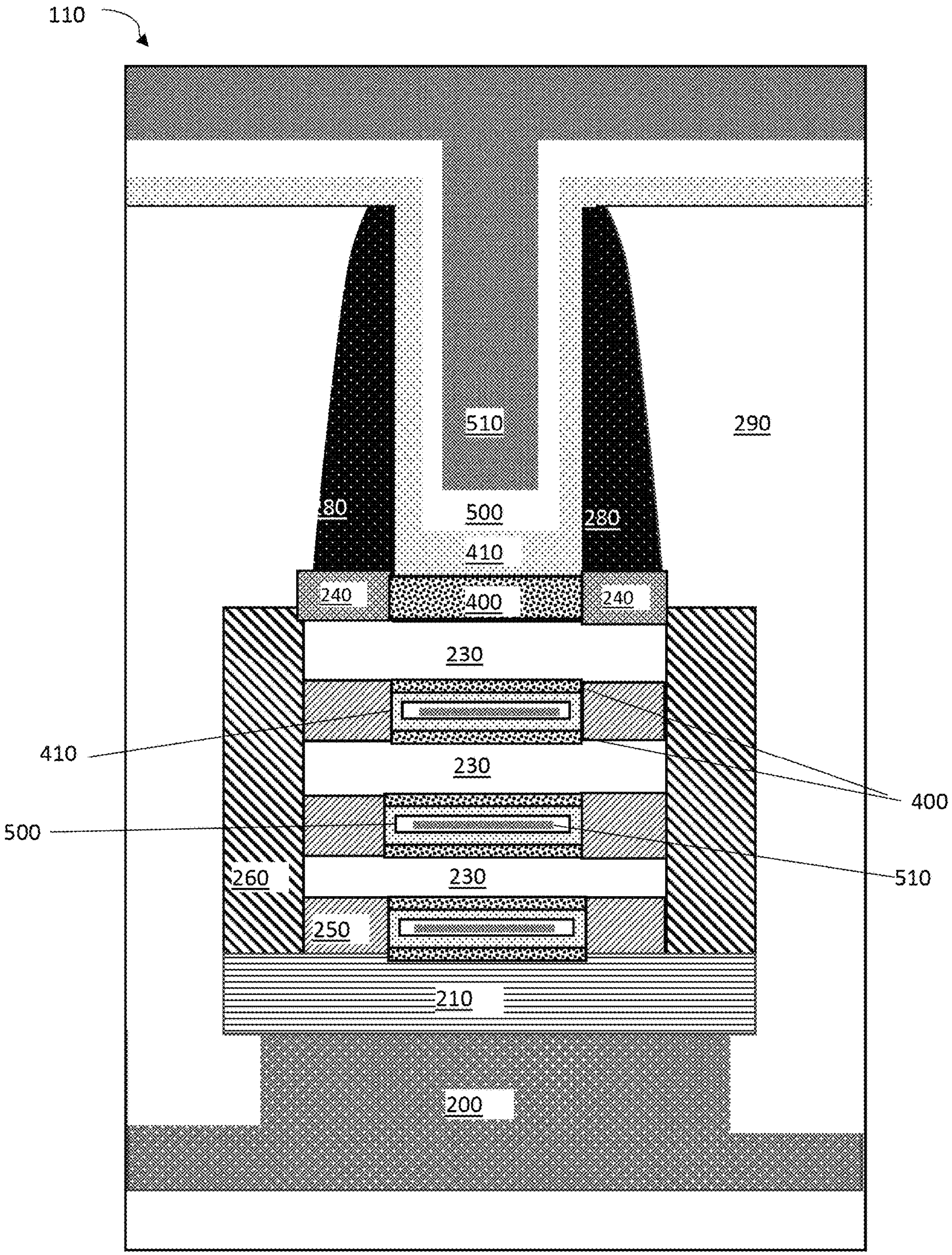
FIGS. 5A-5D are cross-sectional views of the structures of FIGS. 4A-4D after forming a reliability titanium nitride and a polysilicon fill material in the first transistor, in accordance with an aspect of the invention.
Figure 5B:
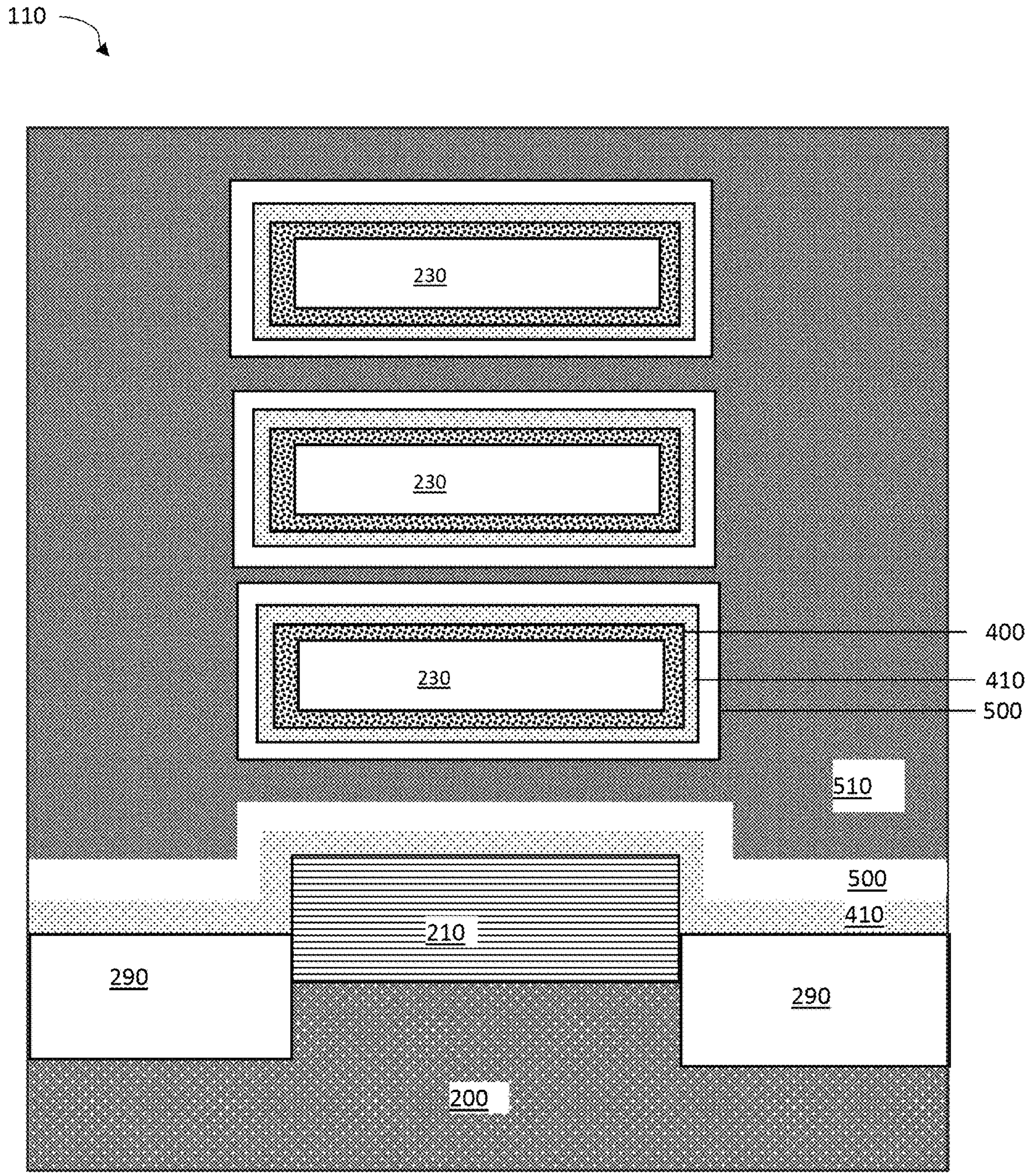
Figure 5C:
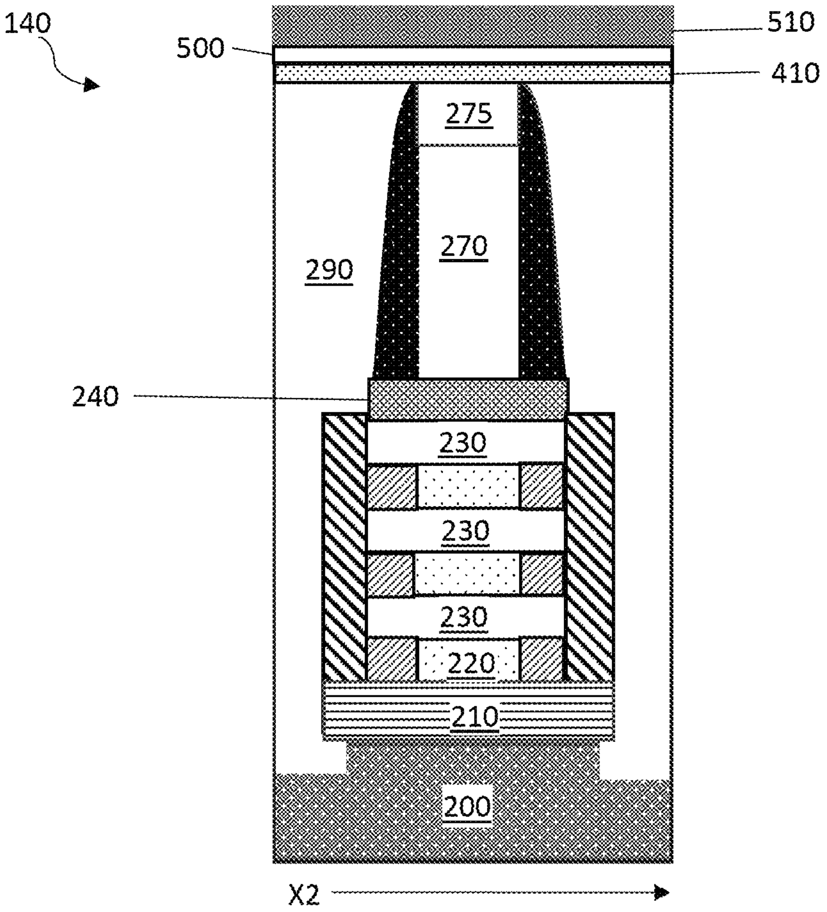
Figure 5D:
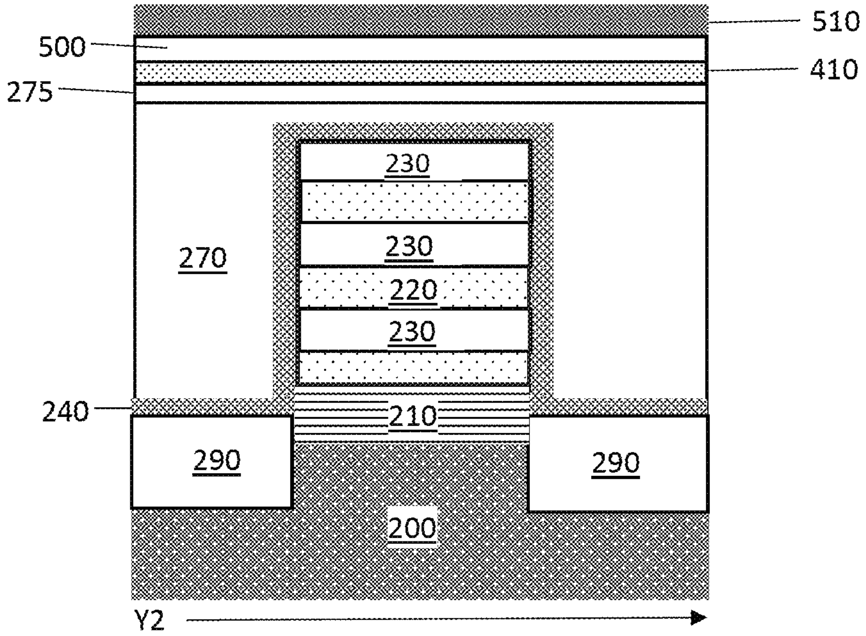
Figure 11A:
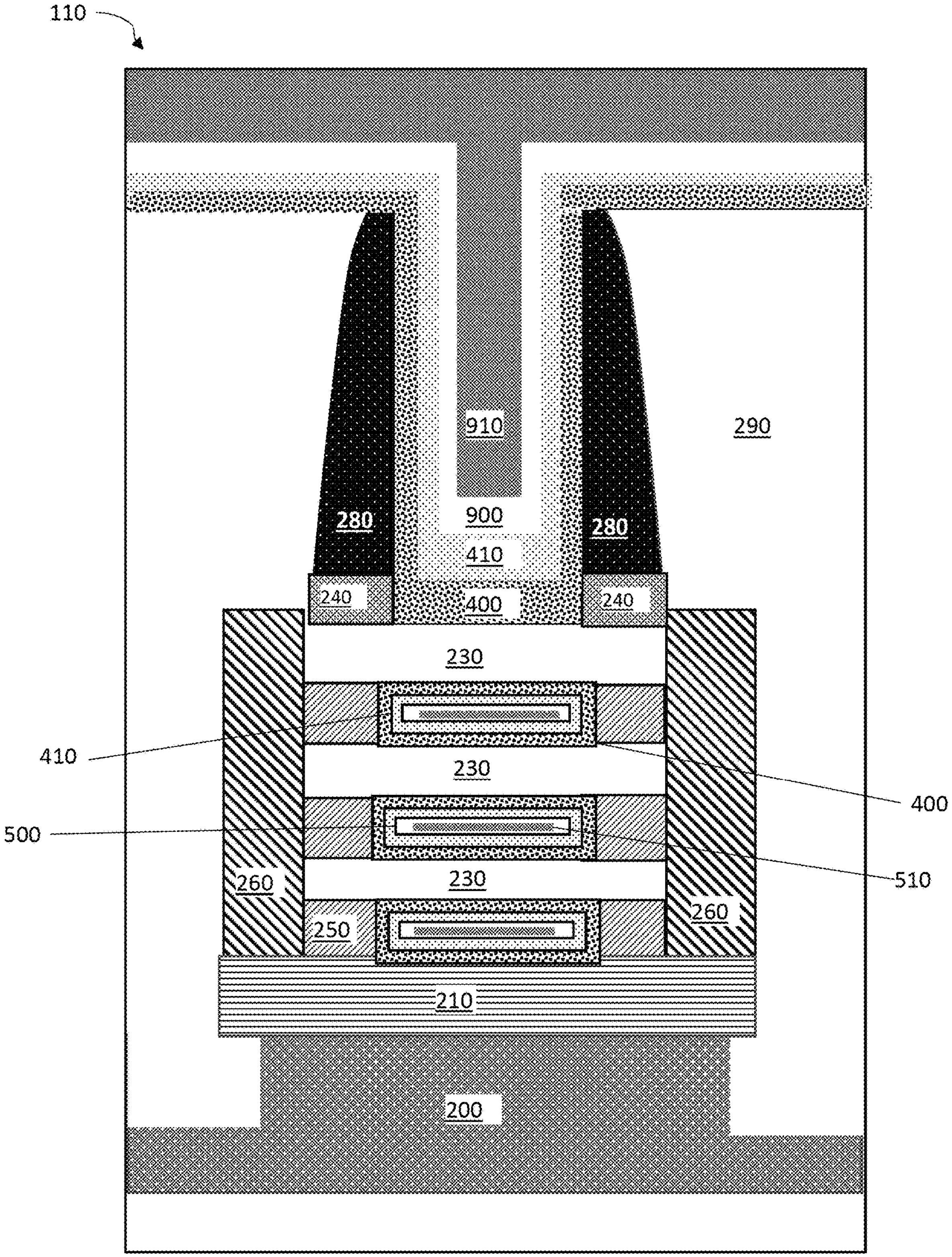
FIGS. 11A-11B are cross-sectional views of the structures of FIGS. 3A-3D after forming a thick gate dielectric and a first high-k material in the first transistor, in accordance with another aspect of the invention.
Figure 11B:
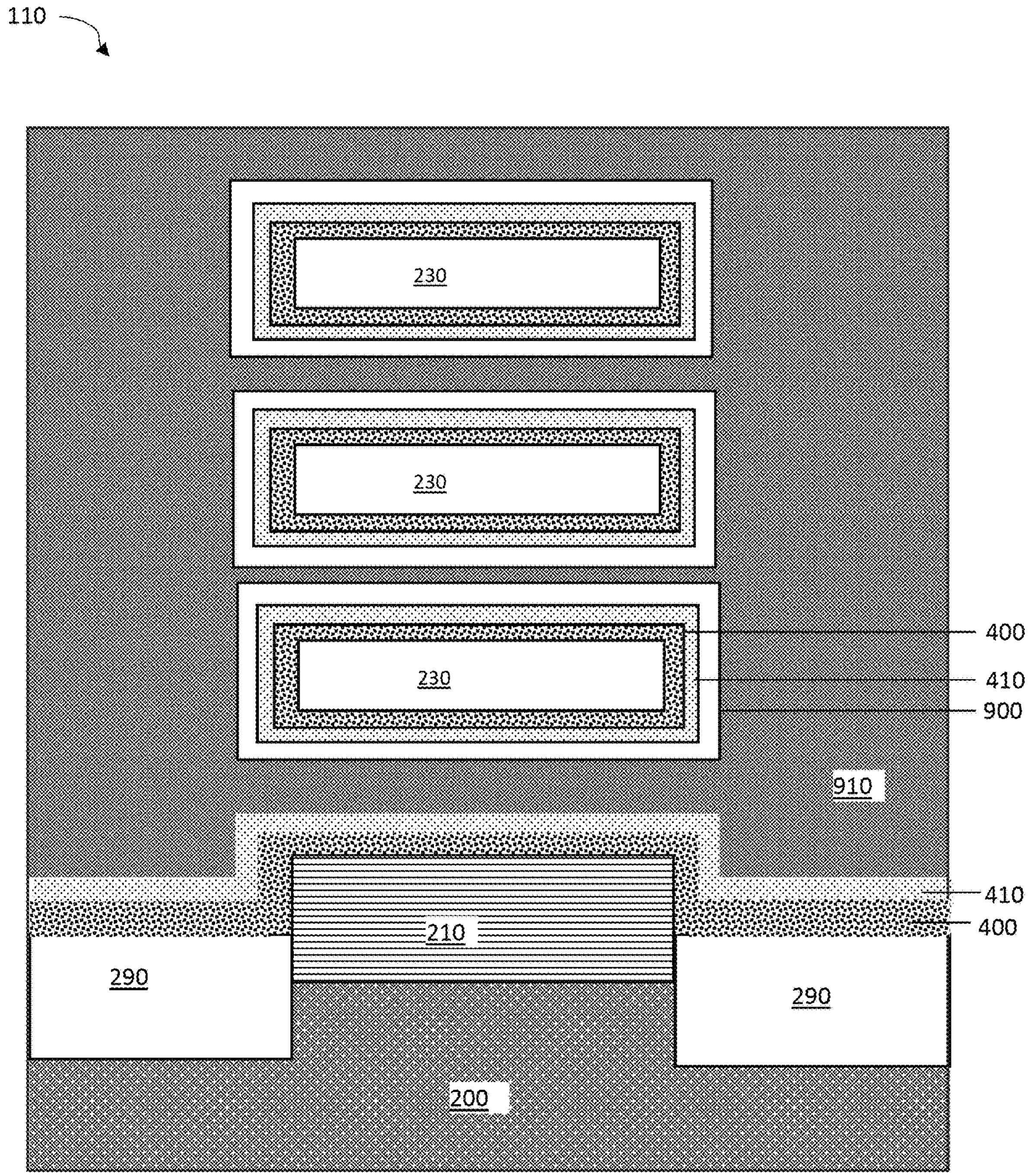

FIGS. 11A-11B show another embodiment wherein the thick gate dielectric 400 lines the gate trench 300-T in a u-shaped fashion so that it not only contacts the bottom of the trench but also runs along the sidewalls of the gate spacer 280 (contrast FIG. 5A's prior embodiment to FIG. 11A). In an embodiment shown in FIG. 11A, the thick gate dielectric 400 lines the entire height of the gate spacer's 280 sidewall. Keeping with FIG. 11A and focusing on the nanosheet stack, the thick gate dielectric 400, in addition to being on exposed surfaces of the nanosheet 230, is also on the surfaces of the inner spacer 250, thereby enclosing the first high-k dielectric 410, reliability TiN 500 and polysilicon fill 510 in this view. Turning to FIG. 11B and in contrast to FIG. 5B, the thick gate dielectric 400 lies on the substrate between the first high-k dielectric 410 and the bottom dielectric 210 layer and isolation.

The FIGS. 11A-11B embodiment is then processed as previously described in conjunction with FIGS. 6A-10D with the clarification that the first high-k dielectric 410 is not recessed or removed from the structure. The resulting structure is seen in FIGS. 12A-12B. It should be noted that the thin gate dielectric transistor 140 remains as previously described or alternatively can be processed with the u-shaped thin gate dielectric 800.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. For example, the skilled artisan will be familiar with epitaxial growth, self-aligned contact formation, formation of high-K metal gates, and so on. The term "high-K" has a definite meaning to the skilled artisan in the context of high-K metal gate (HKMG) stacks, and is not a mere relative term. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1*st Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Those skilled in the art will appreciate that the exemplary structures discussed above can be distributed in raw form (i.e., a single wafer having multiple unpackaged chips), as bare dies, in packaged form, or incorporated as parts of intermediate products or end products.

An integrated circuit in accordance with aspects of the present inventions can be employed in essentially any application and/or electronic system. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment (s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor structure, comprising:

a first gate-all-around field effect transistor, the first gate-all-around field effect transistor including:

an upper nanosheet; and a first gate structure; wherein the first gate structure is laterally confined by first gate spacers and surrounds the upper nanosheet and wherein the first gate structure comprises:

a first gate dielectric on the upper nanosheet and a u-shaped first high-k material on a lower portion of the first gate spacers and on the first gate dielectric, and an insulating metal gate cap located above a first metal gate fill and a u-shaped first work function material which is coplanar with the first gate dielectric.

2. The semiconductor structure of claim 1, wherein the first gate structure further comprises:

the u-shaped first work function material in contact with an upper portion of the first gate spacers and in contact with the u-shaped first high-k material; and the first metal gate fill in contact with the u-shaped first work function material.

3. The semiconductor structure of claim 2, wherein the first metal gate fill has a top dimension and a bottom dimension.

4. The semiconductor structure of claim 3, wherein the top dimension is greater than the bottom dimension.

5. The semiconductor structure of claim 1, wherein the first gate dielectric is in contact with the entire height of the first gate spacers and is sandwiched by the first gate spacers and the u-shaped first high-k material on the lower portion of the first gate spacers.

6. The semiconductor structure of claim 1, wherein the first gate dielectric is in contact with all surfaces of the upper nanosheet.

7. The semiconductor structure of claim 1, further comprising an adjacent nanosheet below the upper nanosheet separated by a vertical distance, wherein the first gate dielectric is 20% to 80% of the vertical distance.

8. A semiconductor chip, comprising:

a first transistor, including:

a first gate trench having a first bottom and first sidewalls;

a first upper nanosheet defining the first bottom of the first gate trench;

a first pair of gate spacers above the first upper nanosheet defining a portion of the first sidewalls of the first gate trench, wherein the first pair of gate spacers has a lower portion and an upper portion;

a first gate dielectric on the first upper nanosheet;

a first u-shaped high-k material on the first gate dielectric and on the lower portion of the first pair of gate spacers;

a first top dielectric in contact with the first upper nanosheet and below the first pair of gate spacers, wherein the first top dielectric further defines the first sidewalls of the first gate trench; and the first gate dielectric is laterally confined by the first top dielectric and vertically confined by the first upper nanosheet and the first u-shaped high-k material;

a second transistor including:

a second gate trench having a second bottom and second sidewalls;

a second upper nanosheet defining the second bottom of the second gate trench;

a second pair of gate spacers above the second upper nanosheet defining a portion of the second sidewalls of the second gate trench;

a second gate dielectric on the second upper nanosheet; and a second u-shaped high-k material on the second gate dielectric and on the second sidewalls of the second pair of gate spacers.

9. The semiconductor chip of claim 8, wherein each of the first and second gate dielectrics have a thickness; and wherein the thickness of the first gate dielectric is greater than the thickness of the second gate dielectric.

10. The semiconductor chip of claim 9, wherein the thickness of the first gate dielectric is one to three times the thickness of the second gate dielectric.

11. The semiconductor chip of claim 9, wherein the first and second gate dielectrics include one or more of silicon nitride and a silicon oxide.

12. The semiconductor chip of claim 9, wherein the first and second u-shaped high-k materials are the same materials with the same thicknesses.

13. The semiconductor chip of claim 9, wherein the first gate dielectric is u-shaped and is in contact with the first upper nanosheet, the first top dielectric, and the first pair of gate spacers.

14. The semiconductor chip of claim 13, wherein each of the first gate dielectric and the first u-shaped high-k material have an uppermost portion; and wherein the uppermost portion of the first gate dielectric is higher than the upper most portion of the first u-shaped high-k material.

15. The semiconductor chip of claim 14, further comprising:

a work function material lining the first gate trench;

a metal fill filling the first gate trench;

an insulating metal gate cap located above and in contact with the metal fill and the work function material and which is coplanar with the first gate dielectric.

* * * * *